(12) United States Patent
Arai

(10) Patent No.: US 9,490,969 B2
(45) Date of Patent: Nov. 8, 2016

(54) TRANSMISSION APPARATUS, RECEPTION APPARATUS, AND TRANSMISSION AND RECEPTION SYSTEM

(71) Applicant: FUJIKURA LTD., Tokyo (JP)

(72) Inventor: Yoshinori Arai, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/855,914

(22) Filed: Sep. 16, 2015

(65) Prior Publication Data

US 2016/0006559 A1 Jan. 7, 2016

Related U.S. Application Data

(63) Continuation of application No. PCT/JP2014/061406, filed on Apr. 23, 2014.

(30) Foreign Application Priority Data

Apr. 30, 2013 (JP) ................. 2013-095338

(51) Int. Cl.
*H04L 7/033* (2006.01)
*H03L 7/22* (2006.01)
*H03L 7/183* (2006.01)
*H04L 7/00* (2006.01)
(Continued)

(52) U.S. Cl.
CPC ............ *H04L 7/0331* (2013.01); *H03L 7/183* (2013.01); *H03L 7/22* (2013.01); *H04L 7/0012* (2013.01); *H04L 25/00* (2013.01); *H04N 5/073* (2013.01); *H04L 7/02* (2013.01); *H04L 47/283* (2013.01); *H04N 5/38* (2013.01)

(58) Field of Classification Search
CPC ....... H03L 7/183; H03L 7/22; H04L 47/283; H04L 7/0012; H04L 7/0331; H04L 25/00; H04L 7/02; H04N 5/073
See application file for complete search history.

(56) References Cited

U.S. PATENT DOCUMENTS 7,301,414 B2 * 11/2007 Hino ................. H03J 5/244
331/10
2002/0090917 A1 7/2002 Hirano et al.
(Continued)

FOREIGN PATENT DOCUMENTS

JP 6-164387 A 6/1994
JP 8-279749 A 10/1996
(Continued)

OTHER PUBLICATIONS

International Search Report dated Aug. 12, 2014, issued in counterpart Application No. PCT/JP2014/061406 (2 pages).
(Continued)

*Primary Examiner* — Freshteh N Aghdam
(74) *Attorney, Agent, or Firm* — Westerman, Hattori, Daniels & Adrian, LLP

(57) ABSTRACT

A transmission apparatus transmits a data signal to a reception apparatus with use of a first clock generated on the basis of a clock signal given to the transmission apparatus. The transmission apparatus changes an operation band of a PLL section to an operation band including a frequency of the clock signal which frequency has been measured with use of a second clock independent of the first clock. The transmission apparatus provides the reception apparatus with band information indicative of the operation band to which the operation band of the PLL section has been changed.

13 Claims, 17 Drawing Sheets

(51) Int. Cl.
*H04L 25/00* (2006.01)
*H04N 5/073* (2006.01)
*H04L 12/841* (2013.01)
*H04L 7/02* (2006.01)
*H04N 5/38* (2006.01)

(56) References Cited

U.S. PATENT DOCUMENTS

| | | | |
|---|---|---|---|
| 2005/0237119 A1* | 10/2005 | Irie | H03L 7/113 331/16 |
| 2006/0220757 A1* | 10/2006 | Satake | H03L 7/099 331/179 |
| 2007/0010225 A1* | 1/2007 | Oosawa | H03L 7/0891 455/255 |
| 2007/0052488 A1* | 3/2007 | Kasahara | H03L 7/187 331/16 |
| 2009/0267661 A1* | 10/2009 | Ootsuki | H03L 7/14 327/156 |
| 2009/0270037 A1* | 10/2009 | Ikeda | G09G 5/006 455/41.3 |

FOREIGN PATENT DOCUMENTS

| | | |
|---|---|---|
| JP | 10-289032 A | 10/1998 |
| JP | 2002-208858 A | 7/2002 |
| JP | 2003-87117 A | 3/2003 |

OTHER PUBLICATIONS

Allowance dated Jul. 28, 2015, issued in counterpart Japanese Application No. 2014-555441 (1 page).

* cited by examiner

F I G. 8
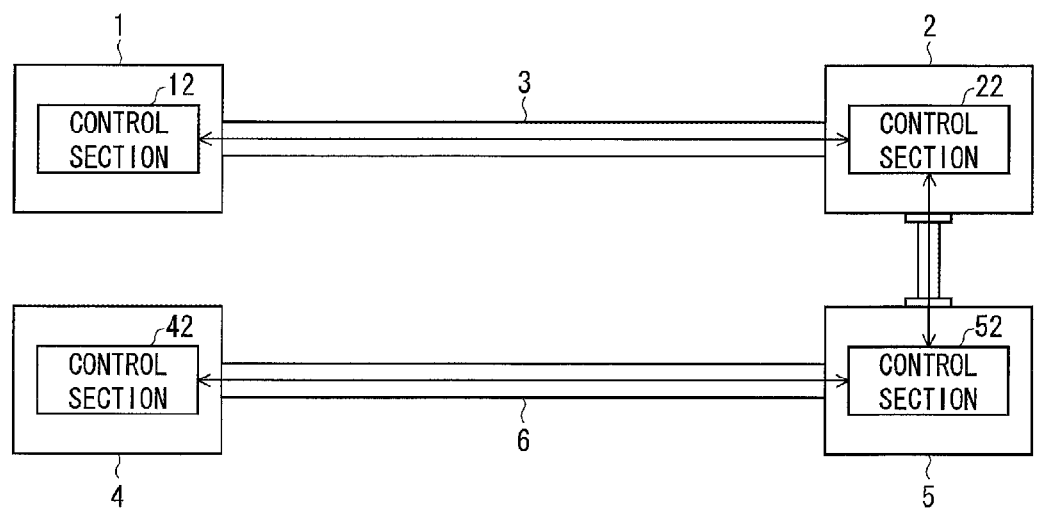

FIG. 11

| fclk (MHz) | COUNT VALUE | A | B | C | D |
|---|---|---|---|---|---|
| 19~21 | 435E~3B91 | 100 | 5000 | 2 | 50 |
| 22~25 | 3B90~3237 | 100 | 4200 | 2 | 42 |
| 26~30 | 3236~29FA | 100 | 3600 | 2 | 36 |
| 31~36 | 29F9~2313 | 100 | 3000 | 2 | 30 |
| 37~41 | 2312~1ED9 | 100 | 2600 | 2 | 26 |
| 42~49 | 1ED8~19DC | 200 | 4400 | 2 | 22 |
| 50~54 | 19DB~177D | 200 | 4000 | 2 | 20 |
| 55~60 | 177C~1528 | 200 | 3600 | 2 | 18 |
| 61~67 | 1527~12F7 | 200 | 3200 | 2 | 16 |
| 68~77 | 12F6~1084 | 200 | 2800 | 2 | 14 |
| 78~90 | 1083~E39 | 200 | 2400 | 2 | 12 |

| fclk (MHz) | COUNT VALUE | LINK COMMAND |
|---|---|---|
| 19～21 | 435E～3B91 | E0 |
| 22～25 | 3B90～3237 | E1 |
| 26～30 | 3236～29FA | E2 |
| 31～36 | 29F9～2313 | E3 |
| 37～41 | 2312～1ED9 | E4 |
| 42～49 | 1ED8～19DC | E5 |
| 50～54 | 19DB～177D | E6 |
| 55～60 | 177C～1528 | E7 |
| 61～67 | 1527～12F7 | E8 |
| 68～77 | 12F6～1084 | E9 |
| 78～90 | 1083～E39 | EA |

(b)

| LINK COMMAND | A | B | C | D |
|---|---|---|---|---|
| E0 | 100 | 5000 | 2 | 50 |
| E1 | 100 | 4200 | 2 | 42 |
| E2 | 100 | 3600 | 2 | 36 |
| E3 | 100 | 3000 | 2 | 30 |
| E4 | 100 | 2600 | 2 | 26 |
| E5 | 200 | 4400 | 2 | 22 |
| E6 | 200 | 4000 | 2 | 20 |
| E7 | 200 | 3600 | 2 | 18 |
| E8 | 200 | 3200 | 2 | 16 |
| E9 | 200 | 2800 | 2 | 14 |
| EA | 200 | 2400 | 2 | 12 |

| Xclk (MHz) | COUNT VALUE | LINK COMMAND |
|---|---|---|
| 19~20 | 435E~3E7A | F0 |
| 21~23 | 3E79~367E | F1 |
| 24~27 | 367D~2E8F | F2 |
| 28~30 | 2E8E~29FA | F3 |
| 31~35 | 29F9~2410 | F4 |
| 36~41 | 240F~1ED9 | F5 |
| 42~45 | 1ED8~1C22 | F6 |
| 46~53 | 1C21~17ED | F7 |
| 54~58 | 17EC~15E2 | F8 |
| 59~65 | 15E1~138B | F9 |
| 66~73 | 138A~116A | FA |
| 74~83 | 1169~F54 | FB |
| 84~90 | F53~E35 | FC |

(b)

| LINK COMMAND | A | B | C | D |
|---|---|---|---|---|
| F0 | 100 | 5600 | 2 | 56 |
| F1 | 100 | 5000 | 2 | 50 |
| F2 | 100 | 4200 | 2 | 42 |
| F3 | 100 | 3800 | 2 | 38 |
| F4 | 100 | 2200 | 3 | 22 |
| F5 | 200 | 2800 | 2 | 28 |
| F6 | 200 | 2600 | 2 | 26 |
| F7 | 200 | 4400 | 2 | 22 |
| F8 | 200 | 4000 | 2 | 20 |
| F9 | 200 | 3600 | 2 | 18 |
| FA | 200 | 3200 | 2 | 16 |
| FB | 200 | 2800 | 2 | 14 |
| FC | 200 | 2400 | 2 | 12 |

FIG. 16

| fclk (MHz) | COUNT VALUE | NUMBER "N" | NUMBER "M" |
|---|---|---|---|
| 20.0~(20.8) | 4000~(3D8A) | 254 | 512 |
| 20.8~(22.2) | 3D8A~(39A8) | 238 | 512 |
| 22.2~(23.6) | 39A8~(363D) | 224 | 512 |
| 23.6~(25.3) | 363D~(3298) | 210 | 512 |
| 25.3~(27.0) | 3298~(2F68) | 196 | 512 |
| 27.0~(28.8) | 2F68~(2C72) | 184 | 512 |
| 28.8~(30.7) | 2C72~(29B1) | 172 | 512 |
| 30.7~(32.6) | 29B1~(2743) | 162 | 512 |
| 32.6~(34.8) | 2743~(24C8) | 152 | 512 |
| 34.8~(37.0) | 24C8~(2298) | 142 | 512 |
| 37.0~(39.4) | 2298~(207D) | 134 | 512 |
| 39.4~(42.0) | 207D~(1E7A) | 126 | 512 |
| 42.0~(45.0) | 1E7A~(1C72) | 118 | 512 |
| 45.0~(48.4) | 1C72~(1A72) | 110 | 512 |
| 48.4~(51.8) | 1A72~(18B6) | 102 | 512 |
| 51.8~(55.0) | 18B6~(1746) | 96 | 512 |
| 55.0~(59.0) | 1746~(15B2) | 90 | 512 |
| 59.0~(63.0) | 15B2~(1451) | 84 | 512 |
| 63.0~(68.4) | 1451~(12B7) | 78 | 512 |
| 68.4~(74.2) | 12B7~(1140) | 72 | 512 |
| 74.2~(80.0) | 1140~(1000) | 66 | 512 |
| 80.0~(85.0) | 1000~(F0F) | 62 | 512 |
| 85.0~90.0 | F0F~E39 | 58 | 512 |

| fclk (MHz) | COUNT VALUE | LINK COMMAND |
|---|---|---|
| 20.0~(21.8) | 4000~(3AFC) | 30 |
| 21.8~(23.7) | 3AFC~(363D) | 31 |
| 23.7~(25.7) | 363D~(3200) | 32 |
| 25.7~(27.9) | 3200~(2E0B) | 33 |
| 27.9~(30.2) | 2E0B~(2A86) | 34 |
| 30.2~(32.8) | 2A86~(2725) | 35 |
| 32.8~(35.6) | 2725~(240E) | 36 |
| 35.6~(38.5) | 240E~(2155) | 37 |
| 38.5~(41.8) | 2155~(1EB2) | 38 |
| 41.8~(45.5) | 1EB2~(1C32) | 39 |
| 45.5~(49.4) | 1C32~(19F7) | 3A |
| 49.4~(53.5) | 19F7~(17F8) | 3B |
| 53.5~(57.8) | 17F8~(162F) | 3C |
| 57.8~(62.8) | 162F~(146A) | 3D |
| 62.8~(68.0) | 146A~(12DA) | 3E |
| 68.0~(74.2) | 12DA~(1146) | 3F |
| 74.2~(80.4) | 1146~(FF1) | 41 |
| 80.4~(87.7) | FF1~(E9D) | 42 |
| 87.8~(90.0) | E9D~E39 | 43 |

(b)

| LINK COMMAND | NUMBER "N" | NUMBER "M" |
|---|---|---|
| 30 | 265 | 512 |
| 31 | 265 | 512 |
| 32 | 244 | 512 |
| 33 | 225 | 512 |
| 34 | 207 | 512 |
| 35 | 191 | 512 |
| 36 | 176 | 512 |
| 37 | 162 | 512 |
| 38 | 150 | 512 |
| 39 | 138 | 512 |
| 3A | 127 | 512 |
| 3B | 117 | 512 |
| 3C | 108 | 512 |
| 3D | 100 | 512 |
| 3E | 92 | 512 |
| 3F | 85 | 512 |
| 41 | 78 | 512 |
| 42 | 72 | 512 |
| 43 | 66 | 512 |

TRANSMISSION APPARATUS, RECEPTION APPARATUS, AND TRANSMISSION AND RECEPTION SYSTEM

CROSS-REFERENCE TO RELATED APPLICATIONS

This application is a Continuation of PCT International Application No. PCT/JP2014/061406 filed in Japan on Apr. 23, 2014, which claims the benefit of Patent Application No. 2013-095338 filed in Japan on Apr. 30, 2013, the entire contents of which are hereby incorporated by reference.

TECHNICAL FIELD

The present invention relates to (i) a transmission apparatus which transmits a data signal, (ii) a transmission method of transmitting a data signal, (iii) a reception apparatus which receives a data signal, (iv) a reception method of receiving a data signal, and (v) a transmission and reception system including the transmission apparatus and the reception apparatus.

BACKGROUND ART

A transmission and reception system for transmitting and receiving data signals often uses a clock signal to determine a transmission clock and a reception clock. In a transmission and reception system, such as Camera Link (Registered Trademark), in which a cycle of a clock signal is not identical to those of a transmission clock and a reception clock, a transmitter and a receiver use respective PLL (Phase Locked Loop) circuits so as to generate a transmission clock from a clock signal or so as to generate a clock signal from a reception clock. For example, in the Camera Link, a PLL circuit of a transmitter generates a transmission clock whose cycle is 2/7 times as long as that of a clock signal (whose frequency is 7/2 times as high as that of the clock signal). The transmitter transmits data at every rising edge of and at every falling edge of the transmission clock. In the Camera Link, a receiver reproduces, from a data signal which the receiver has received, a reception clock whose cycle is identical to that of the transmission clock. A PLL circuit of the receiver restores, from the reception clock, a clock signal whose cycle is 7/2 times as long as that of the reception clock (whose frequency is 2/7 times as high as that of the reception clock).

A PLL circuit typically has limitation on its operation band. Therefore, in a case where a bandwidth of a signal which a PLL circuit receives is large, a plurality of PLL circuits having respective different operation bands are prepared, and one of the plurality of PLL circuits which is to be used is selected in accordance with a frequency of the signal which the PLL circuit receives. The PLL circuit to be used is selected on the basis of a LOCK signal (which becomes active while the PLL circuit is stably operating) of the PLL circuit. On the other hand, the PLL circuit sometimes maintains a LOCK state in response to an input signal that exceeds a predetermined operation band. That is, it is difficult to correctly determine, from a state of a LOCK signal, whether or not the PLL circuit is properly operating.

In a case where the PLL circuit maintains the LOCK state in response to the input signal that exceeds the predetermined operation band, it is necessary to cause the PLL circuit to stably operate by resetting an operation of the PLL circuit. An example of a method of resetting the operation of the PLL circuit is a method of resetting the PLL circuit of the transmitter which resetting is triggered when the PLL circuit of the receiver is not in a LOCK state (i.e., an input signal exceeding the predetermined operation band is inputted). However, there is a possibility that the PLL circuit of the receiver is not optimized like the PLL circuit of the transmitter. That is, a case can be caused in which an operation band of the PLL circuit of the transmitter is inconsistent with that of the PLL circuit of the receiver (the PLL circuit of the transmitter and the PLL circuit of the receiver operate within respective different operation bands). Other examples of the method of resetting the operation of the PLL circuit are described in Patent Literatures 1 and 2 as below.

Patent Literature 1 describes a PLL circuit which, when a control electric potential of a voltage control oscillator circuit (VCO) reaches a predetermined upper limit or lower limit, automatically adjusts the number of stages of a ring oscillator to an optimal number of stages so that an output of the VCO has a desired frequency. The invention described in Patent Literature 1 makes it possible to reduce gain of the VCO even in a case where a variable frequency band is large. This allows the PLL circuit to be resistant to external noise.

Patent Literature 2 describes a clock circuit including (i) a clock comparator circuit which compares a constant frequency with a clock signal supplied from an input buffer, (ii) a multiplication setting circuit which sets a multiplication of a PLL on the basis of a multiplication selection signal, and (iii) a multiplication and frequency division setting circuit which sets a multiplication value of the PLL and a frequency division value of a frequency divider circuit on the basis of a multiplication and frequency division setting signal supplied from the multiplication setting circuit. The invention described in Patent Literature 2 makes it possible to automatically set a multiplication in accordance with a frequency of a bus without externally setting the multiplication.

CITATION LIST

Patent Literature

[Patent Literature 1]
Japanese Patent Application Publication, Tokukai, No. 2003-87117 (Publication Date: Mar. 20, 2003)
[Patent Literature 2]
Japanese Patent Application Publication, Tokukaihei, No. 10-289032 (Publication Date: Oct. 27, 1998)

SUMMARY OF INVENTION

Technical Problem

In order to improve stability of communication, it is necessary to cause a transmitter and a receiver to share various settings. The transmitter and the receiver should share, for example, setting of operation bands of PLL circuits.

On the other hand, according to the above conventional techniques, a transmitter and a receiver include respective PLL circuits whose operation bands are independently changed. It is therefore uncertain whether or not the operation band of the PLL circuit of the transmitter is consistent with that of the PLL circuit of the receiver. Inconsistency of the operation bands makes it impossible to correct a frequency even in a case where the PLL circuits are operating within frequency bands outside of stable operation ranges. This can cause a defect due to, for example, change of environmental conditions.

The present invention was made in view of the problem, and an object of the present invention is to improve stability of communication during transmission and reception of data between a transmitter and a receiver.

Solution to Problem

In order to attain the object, a transmission apparatus of the present invention is configured to include: a PLL (Phase Locked Loop) section which generates a first clock on the basis of a clock signal given to the PLL section; a data signal transmitting section which transmits, with use of the first clock generated by the PLL section, a data signal given to the data signal transmitting section together with the clock signal being given to the PLL section; and a control section which measures a frequency of the clock signal with use of a second clock independent of the first clock, the control section (i) changing setting of the transmission apparatus to setting corresponding to a measured frequency and (ii) providing, with setting information indicative of the setting to which the setting of the transmission apparatus has been changed, a reception apparatus to which the data signal is to be transmitted.

In order to attain the object, a reception apparatus of the present invention is configured to include: a data signal receiving section which (i) reproduces a clock synchronizing with a first clock with use of which a transmission apparatus transmits a data signal, the data signal receiving section reproducing the clock from the data signal which the transmission apparatus has transmitted and (ii) receives, with use of the clock synchronizing with the first clock, the data signal which the transmission apparatus has transmitted; a clock signal restoring section which restores, on the basis of the clock synchronizing with the first clock, a clock signal with reference to which the transmission apparatus generates the first clock; and a control section which (i) obtains, from the transmission apparatus, setting information indicative of setting of the transmission apparatus and (ii) changes setting of the reception apparatus to the setting indicated by the setting information.

In order to attain the object, a transmission method of the present invention is configured to include the steps of: (a) generating a first clock on the basis of a clock signal given; (b) transmitting, with use of the first clock generated in the step (a), a data signal given together with the clock signal being given; (c) measuring a frequency of the clock signal with use of a second clock independent of the first clock; (d) changing setting of a transmission apparatus to setting corresponding to a measured frequency; and (e) providing, with setting information indicative of the setting to which the setting of the transmission apparatus has been changed, a reception apparatus to which the data signal is to be transmitted.

In order to attain the object, a reception method of the present invention is configured to include the steps of: reproducing a clock synchronizing with a first clock with use of which a transmission apparatus transmits a data signal, the clock being reproduced from the data signal which the transmission apparatus has transmitted; receiving, with use of the clock synchronizing with the first clock, the data signal which the transmission apparatus has transmitted; restoring, on the basis of the clock synchronizing with the first clock, a clock signal with reference to which the transmission apparatus generates the first clock; obtaining, from the transmission apparatus, setting information indica- tive of setting of the transmission apparatus; and changing setting of a reception apparatus to the setting indicated by the setting information.

Advantageous Effects of Invention

According to the present invention, it is possible to improve stability of communication during transmission and reception of data between a transmitter and a receiver.

Figure 3:
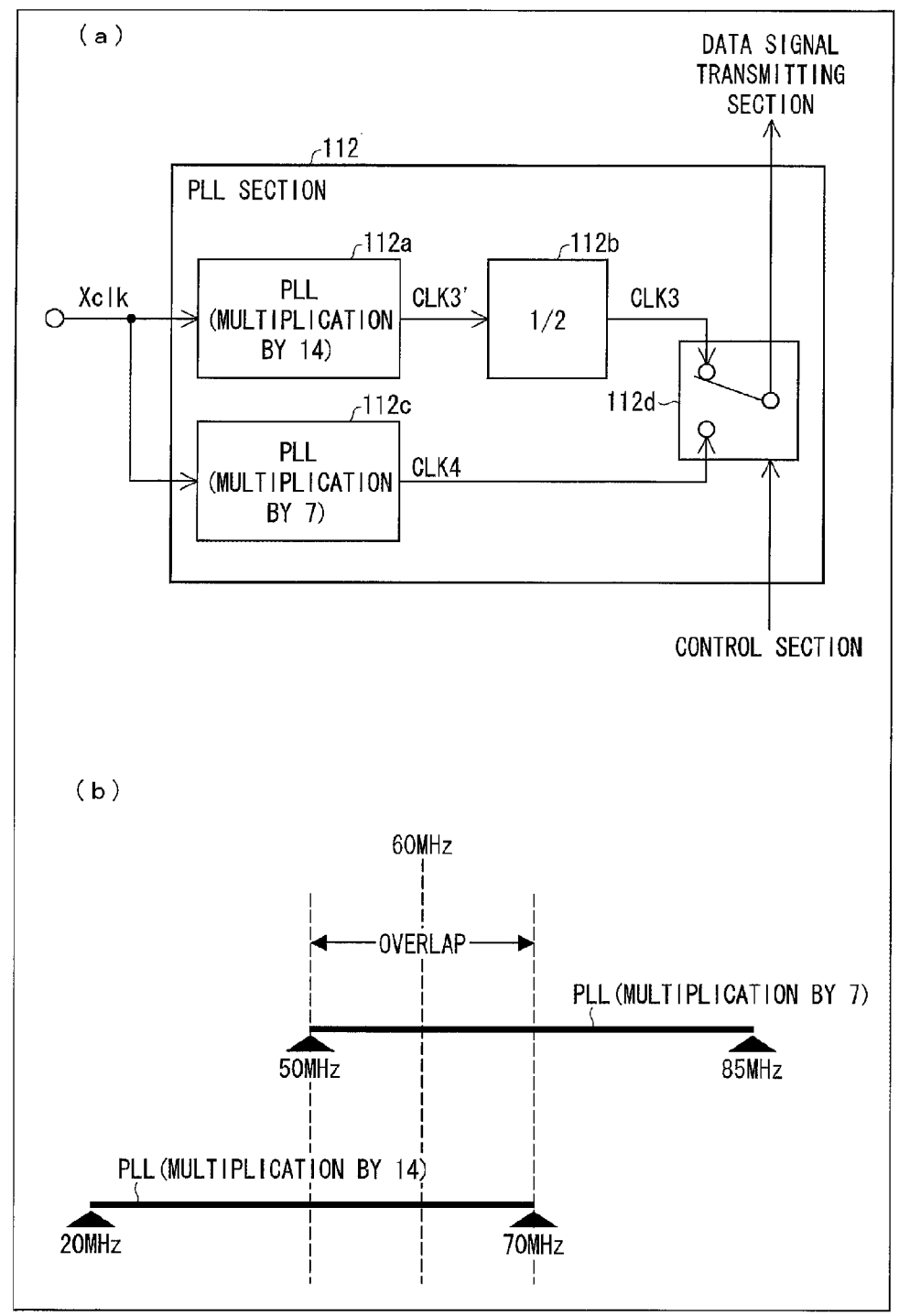

(a) of FIG. 3 is a block diagram illustrating an example configuration of a PLL section of the transmission apparatus of Embodiment 1 of the present invention. (b) of FIG. 3 is a graph illustrating operation bands of respective PLL circuits included in the PLL section illustrated in (a) of FIG. 3.

Figure 4:
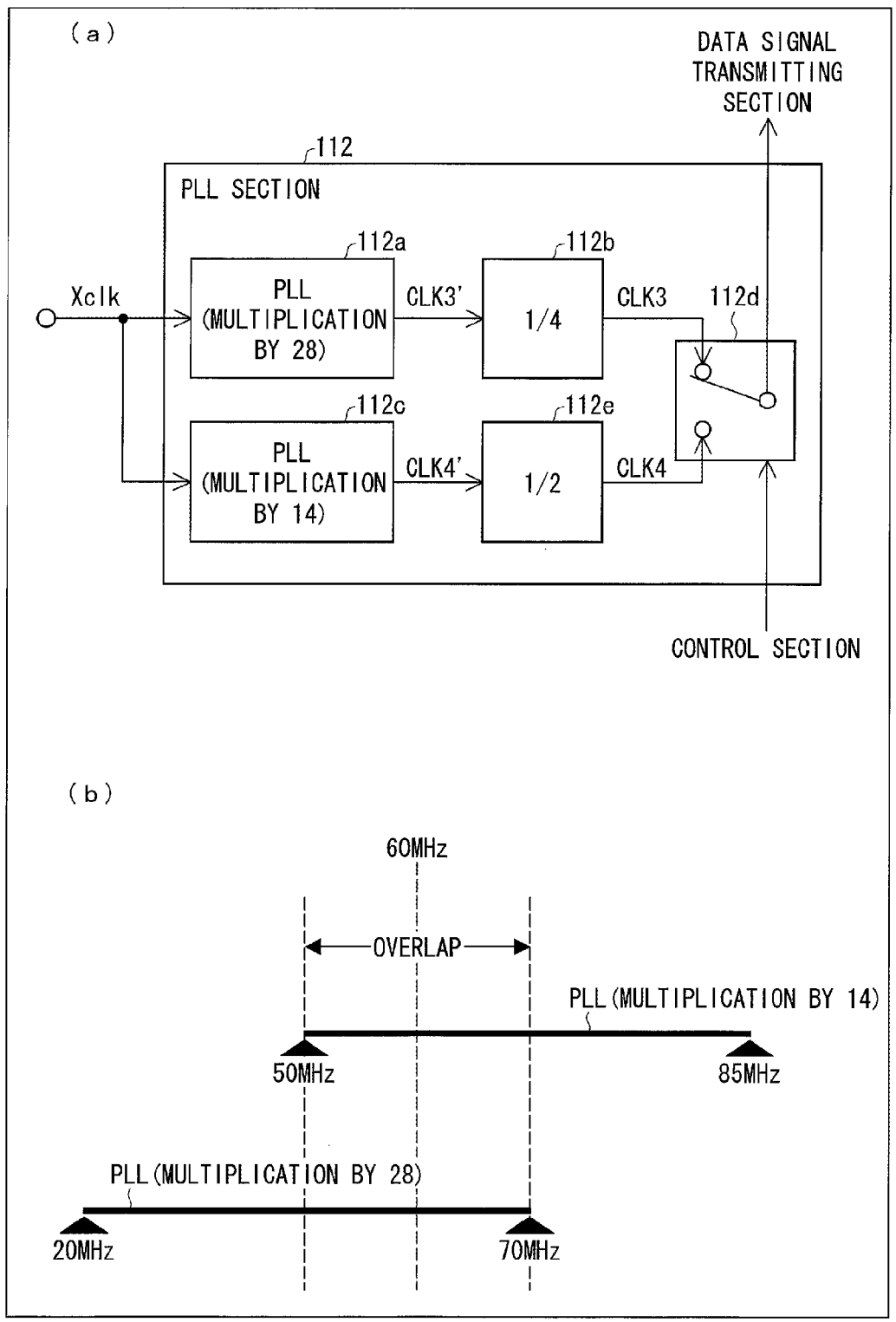

(a) of FIG. 4 is a block diagram illustrating a modification of the PLL section of the transmission apparatus of Embodiment 1 of the present invention. (b) of FIG. 4 is a graph illustrating operation bands of respective PLL circuits included in a PLL section illustrated in (a) of FIG. 4.

Figure 5:
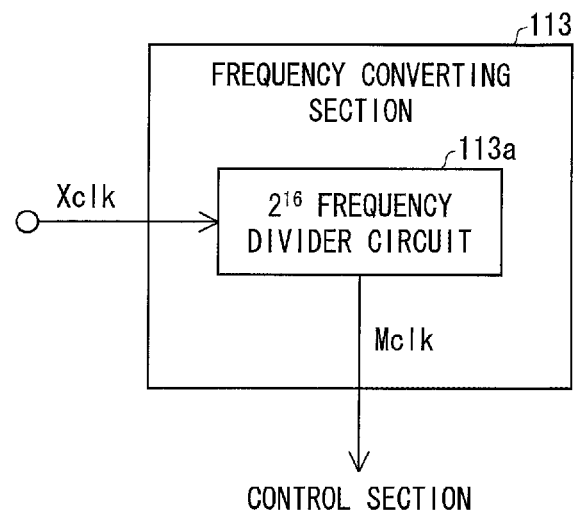

FIG. 5 is a block diagram illustrating an example configuration of a frequency converting section of the transmission apparatus of Embodiment 1 of the present invention.

Figure 6:
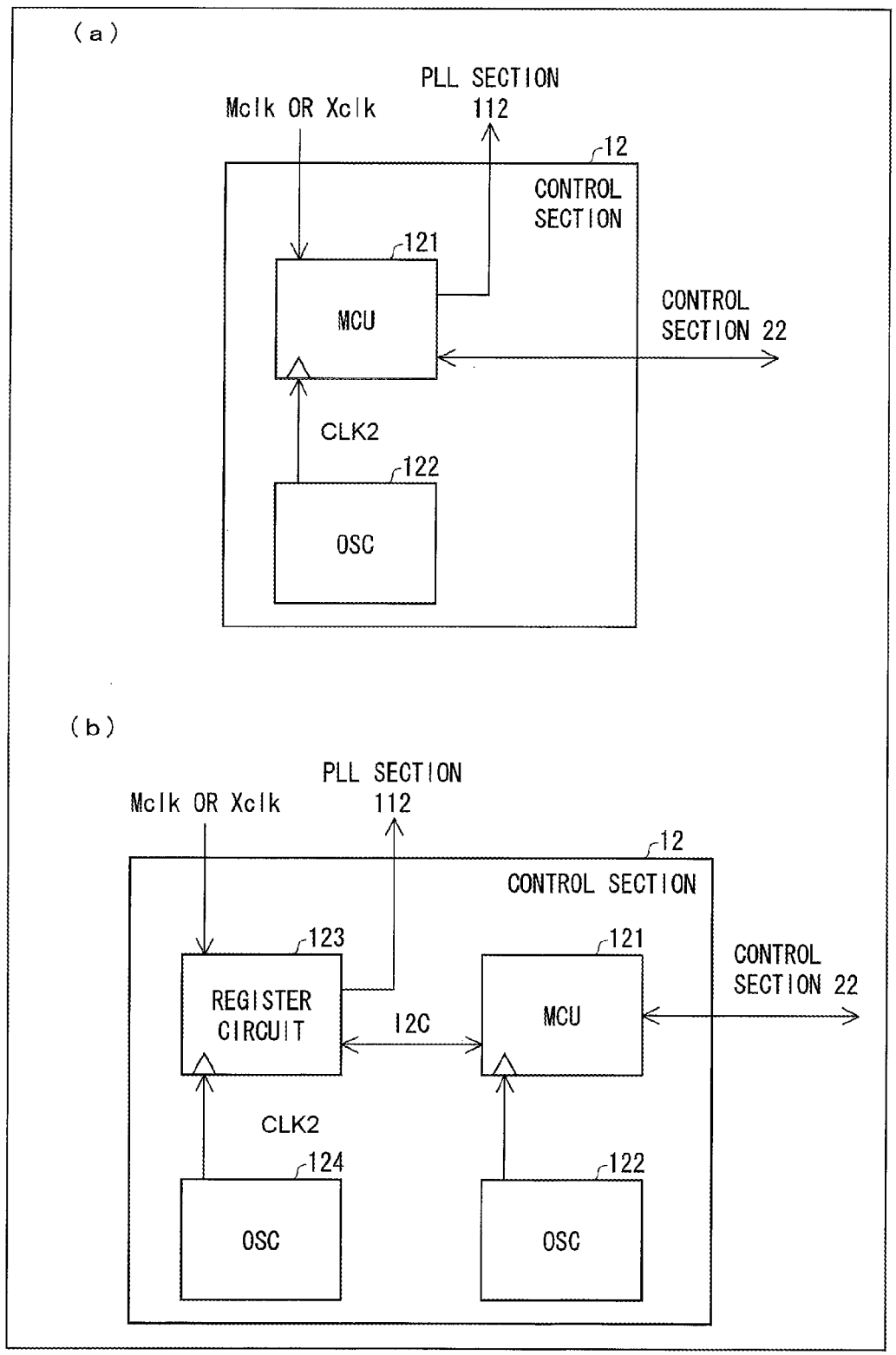

(a) of FIG. 6 is a block diagram illustrating an example configuration of a control section of the transmission apparatus of Embodiment 1 of the present invention. (b) of FIG. 6 is a block diagram illustrating a modification of the control section of the transmission apparatus of Embodiment 1 of the present invention.

Figure 7:
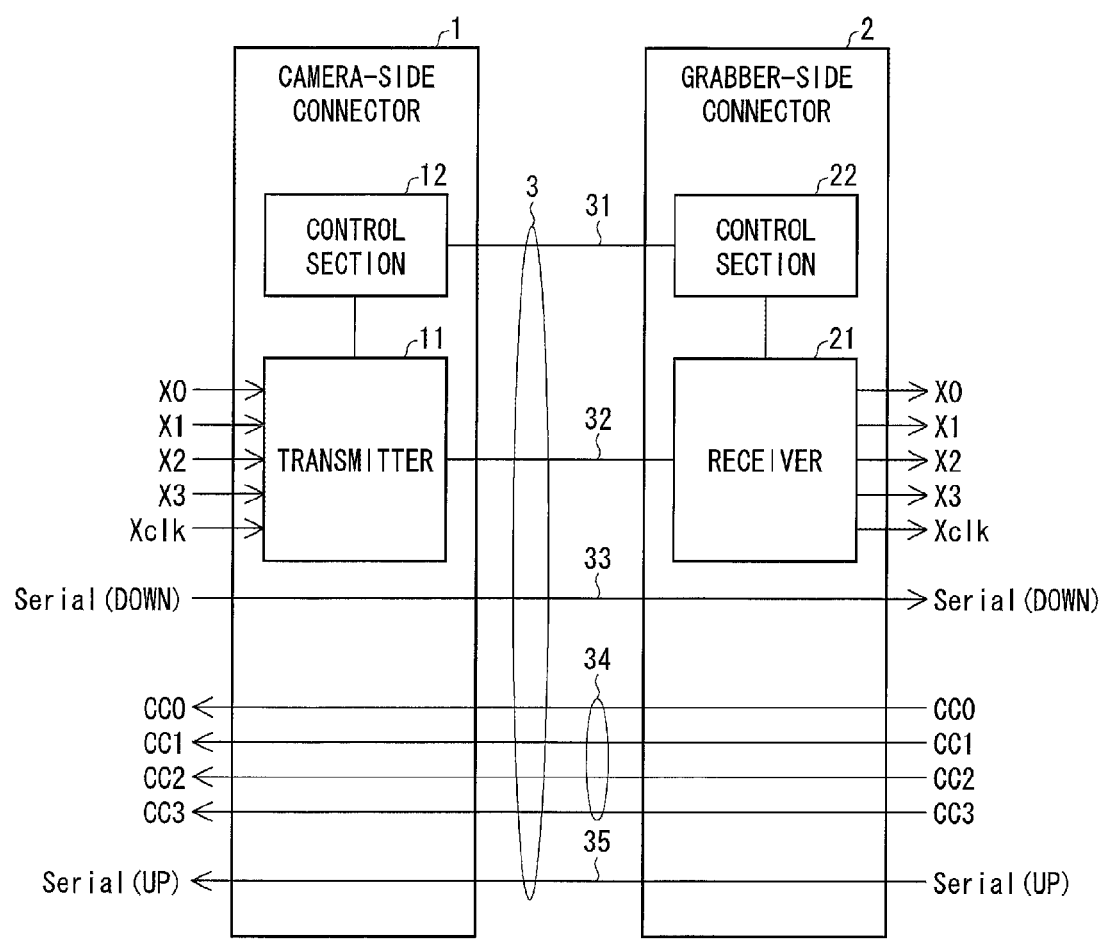

FIG. 7 is a block diagram illustrating a configuration of a transmission and reception system in which the transmission apparatus and the reception apparatus of Embodiment 1 of the present invention are applied to a Camera Link cable.

FIG. 8 is a block diagram illustrating a system configuration which makes it possible to share, with another system, a frequency of a clock signal of the transmission apparatus and the reception apparatus of Embodiment 1 of the present invention.

Figure 9:
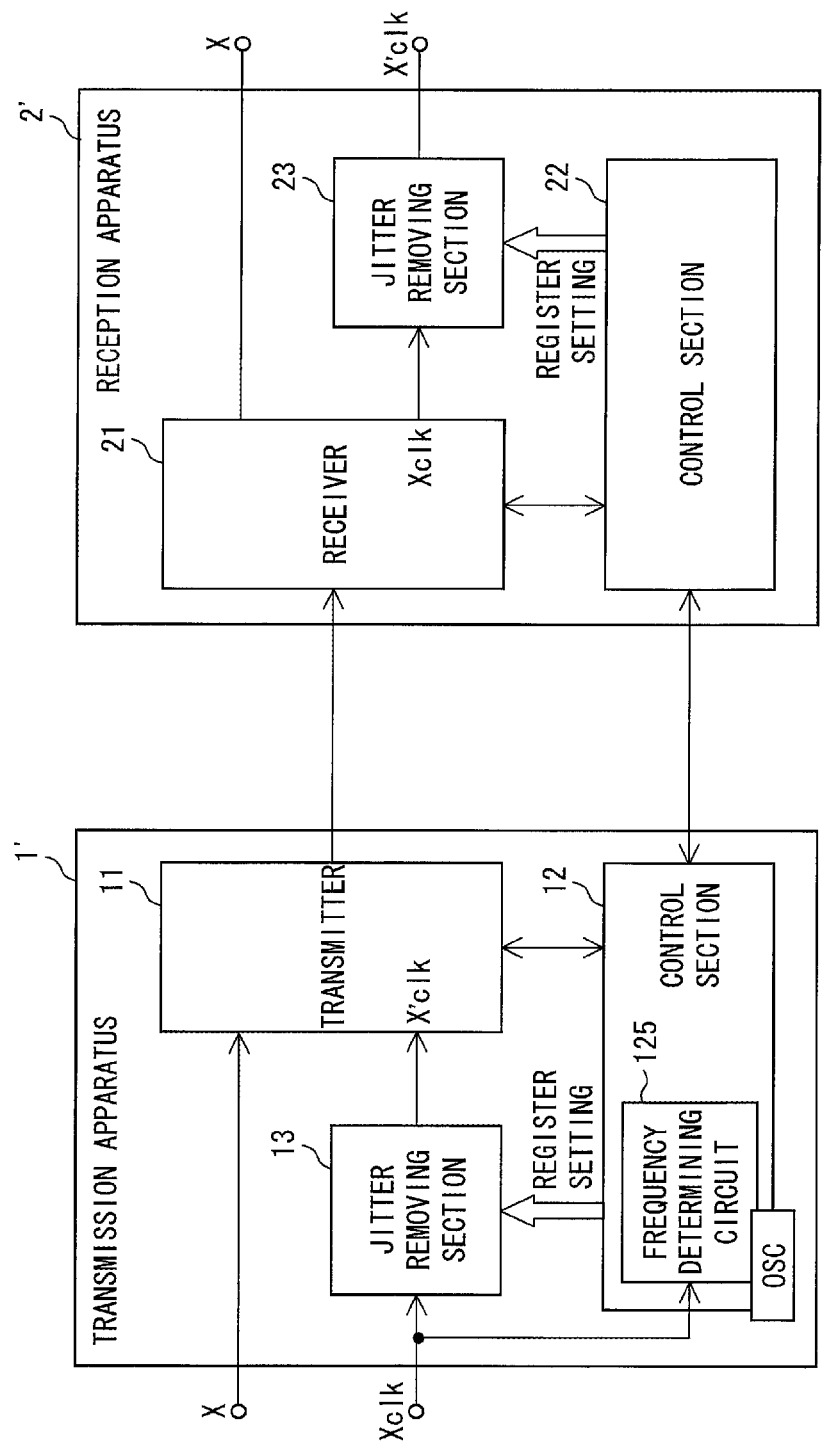

FIG. 9 is a block diagram illustrating configurations of a transmission apparatus and a reception apparatus of Embodiment 2 of the present invention.

Figure 10:
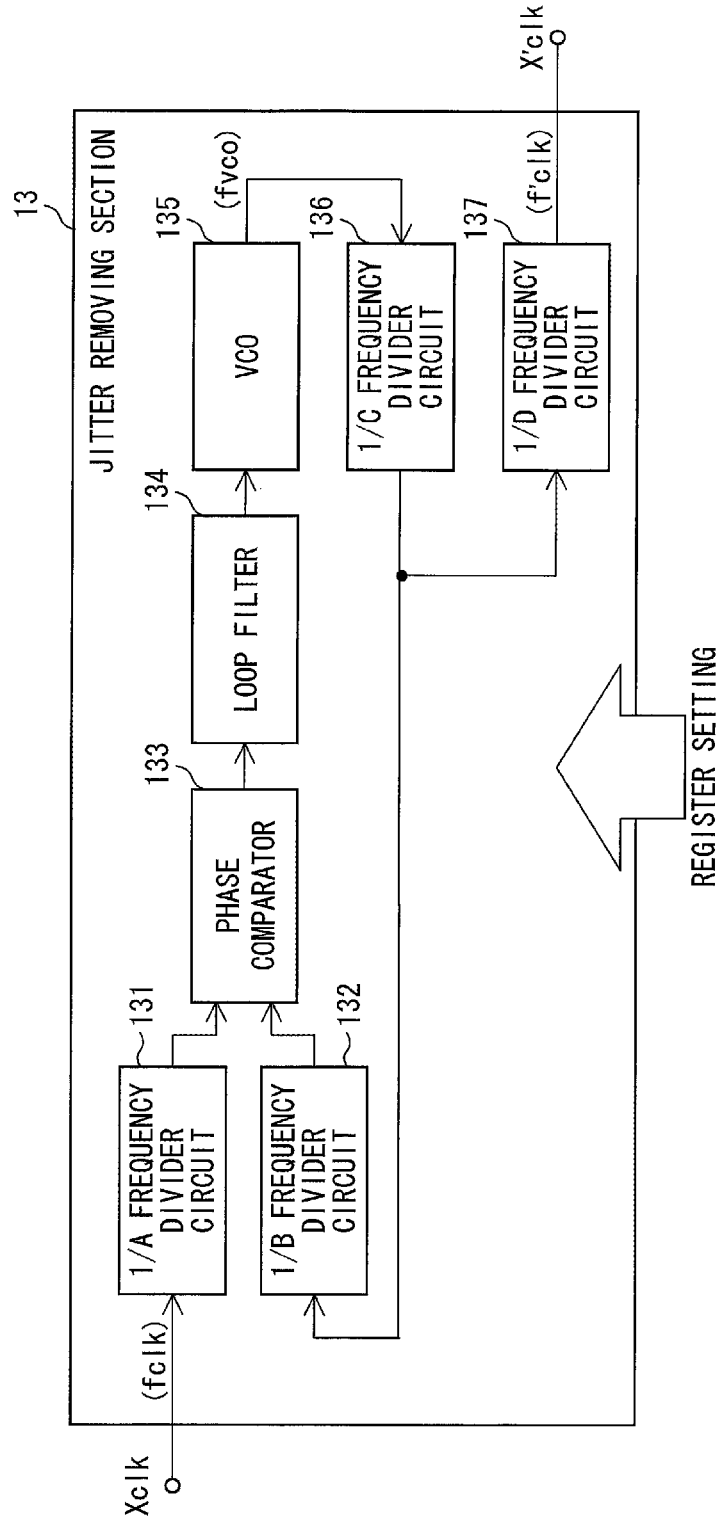

FIG. 10 is a block diagram illustrating an example configuration of a jitter removing section included in the transmission apparatus of Embodiment 2 of the present invention.

FIG. 11 is a table showing an example correspondence, in the transmission apparatus of Embodiment 2 of the present invention, among (i) a range of a frequency of a clock signal, (ii) a range of a count value outputted from a frequency determining circuit, and (iii) frequency division ratios of respective frequency divider circuits included in the jitter removing section.

(a) of FIG. 12 is a table showing an example correspondence, in the transmission apparatus of Embodiment 2 of the present invention, among (i) the range of the frequency of the clock signal, (ii) the range of the count value outputted from the frequency determining circuit, and (iii) a link command. (b) of FIG. 12 is a table showing an example correspondence, in the reception apparatus of Embodiment 2 of the present invention, between (i) a link command and (ii) frequency division ratios of respective frequency divider circuits included in a jitter removing section.

Figure 13:
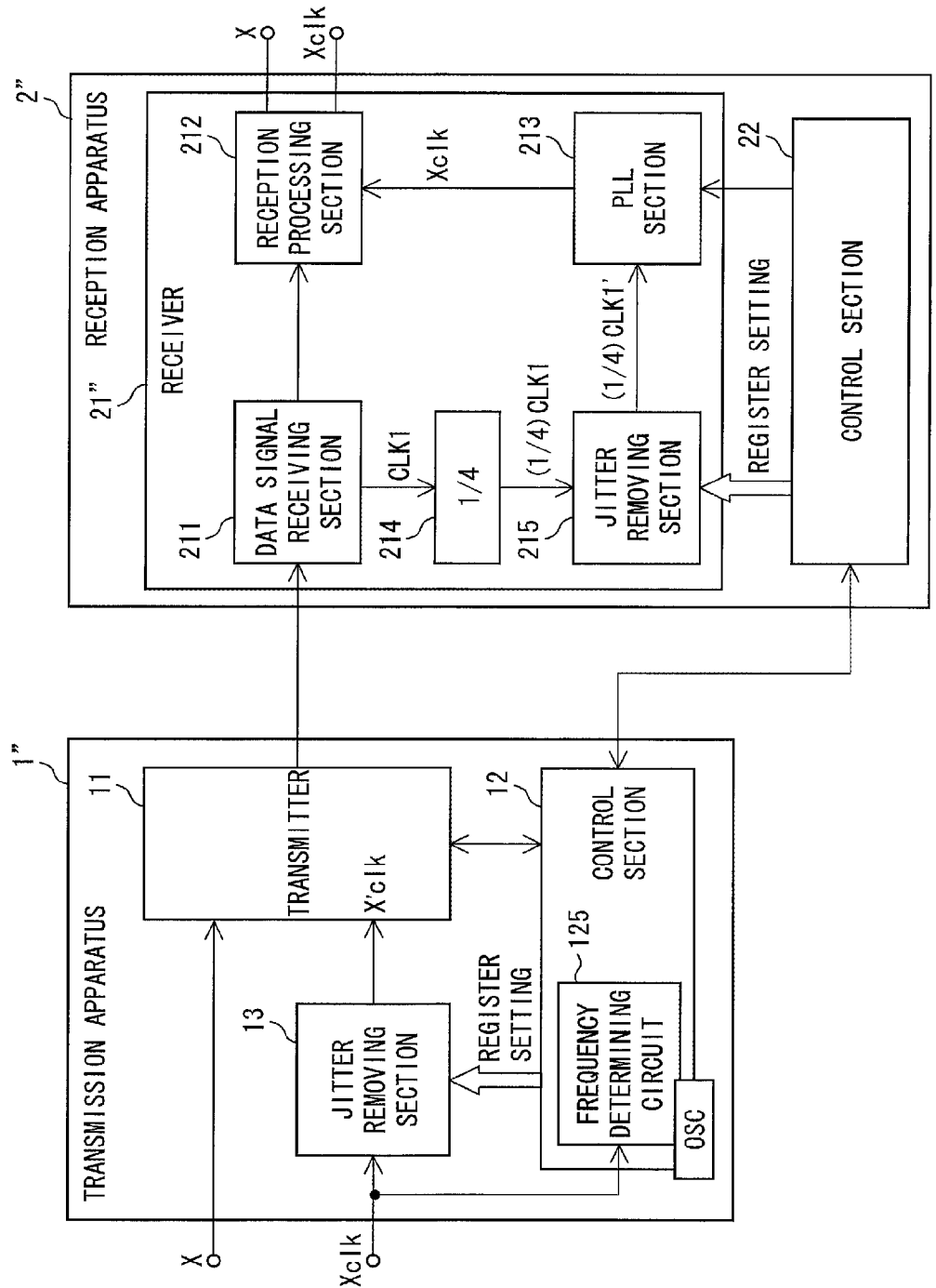

FIG. 13 is a block diagram illustrating configurations of a transmission apparatus and a reception apparatus of Embodiment 3 of the present invention.

(a) of FIG. 14 is a table showing an example correspondence, in the transmission apparatus of Embodiment 3 of the present invention, among (i) a range of a frequency of a clock signal, (ii) a range of a count value outputted from a frequency determining circuit, and (iii) a link command. (b) of FIG. 14 is a table showing an example correspondence, in the reception apparatus of Embodiment 3 of the present invention, between (i) a link command and (ii) frequency division ratios of respective frequency divider circuits included in a jitter removing section.

Figure 15:
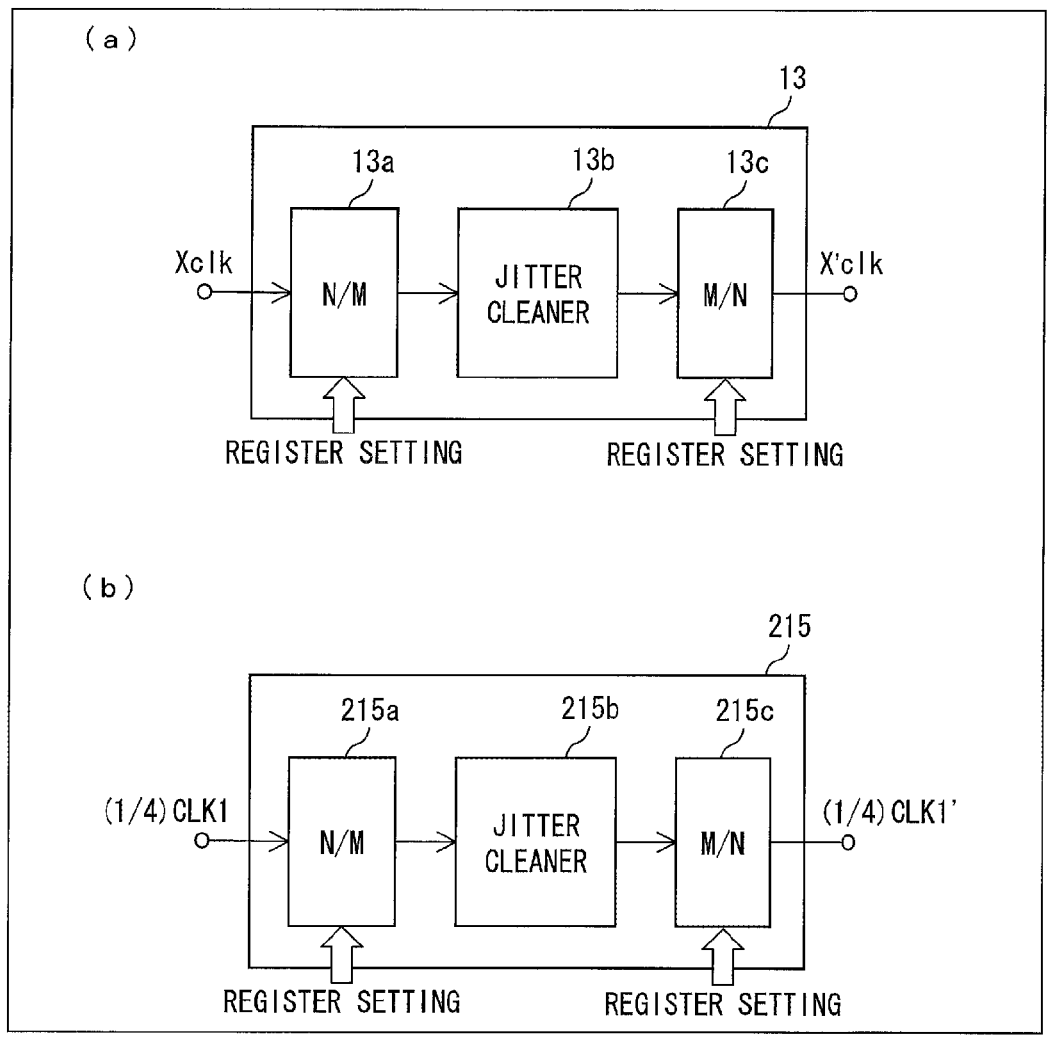

FIG. 15 is a block diagram illustrating a modification of a jitter removing section of the transmission apparatus of Embodiment 3 of the present invention.

FIG. 16 is a table showing an example correspondence, in the transmission apparatus of Embodiment 3 of the present invention, among (i) a range of a frequency of a clock signal, (ii) a range of a count value outputted from the frequency determining circuit, and (iii) numbers "N" and "M" of each frequency divider circuit included in the jitter removing section.

(a) of FIG. 17 is a table showing an example correspondence, in the transmission apparatus of Embodiment 3 of the present invention, among (i) a range of a frequency of a clock signal, (ii) a range of a count value outputted from the frequency determining circuit, and (iii) a link command. (b) of FIG. 17 is a table showing an example correspondence, in the reception apparatus of Embodiment 3 of the present invention, between (i) a link command and (ii) numbers "N" and "M" of each of the frequency divider circuits included in the jitter removing section.

DESCRIPTION OF EMBODIMENTS

<<Embodiment 1>>

The following description will discuss Embodiment 1 of the present invention with reference to the drawings.

[Configurations of Transmission Apparatus and Reception Apparatus]

Figure 1:
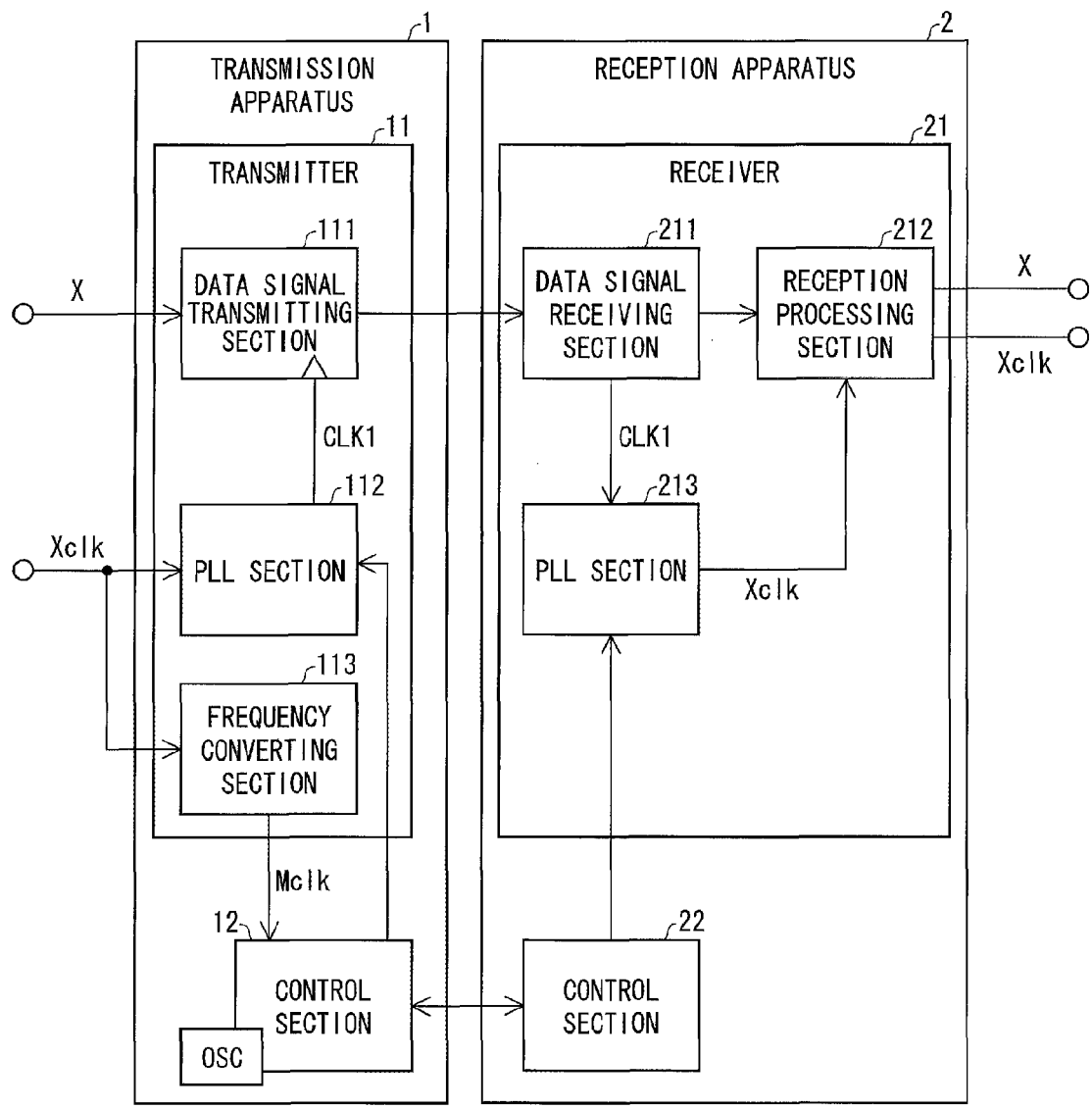
FIG. 1 is a block diagram illustrating configurations of a transmission apparatus and a reception apparatus of Embodiment 1 of the present invention.

Configurations of a transmission apparatus 1 and a reception apparatus 2 of Embodiment 1 will be described with reference to FIG. 1. FIG. 1 is a block diagram illustrating configurations of sections of the transmission apparatus 1 and the reception apparatus 2. The transmission apparatus 1 is an apparatus configured to transmit a data signal X to the reception apparatus 2. The reception apparatus 2 is an apparatus configured to receive the data signal X from the transmission apparatus 1.

Note that the data signal X may be an electrical signal, an optical signal, a serial signal, or a parallel signal. For example, in a case where the transmission apparatus 1 is used as a camera-side connector in conformity to Camera Link, the data signal X is a parallel signal (data signals X0 through X3) transmitted through four pairs of electrical signal lines, or a serial signal into which the parallel signal is serialized, the serial signal being transmitted through a single electrical signal line or a pair of electrical signal lines (in a case of a differential method). Alternatively, in a case where the transmission apparatus 1 is used as a camera-side connector in conformity to an optical Camera Link, the data signal X is an optical signal into which the serial signal is E/O converted, the optical signal being transmitted through a signal optical fiber.

As illustrated in FIG. 1, the transmission apparatus 1 includes a transmitter 11 and a control section 12. The transmitter 11 includes a data signal transmitting section 111, a PLL section 112, and a frequency converting section 113. The following description will discuss functions of respective blocks included in the transmission apparatus 1.

The data signal transmitting section 111 is means for transmitting a data signal X to the reception apparatus 2 with use of a clock (first clock) CLK1 generated in the PLL section 112 (later described), the data signal X having been supplied from an external apparatus (such as a camera).

The PLL section 112 is means for generating a first clock CLK1 on the basis of a clock signal Xclk supplied together with a data signal X. In Embodiment 1, the PLL section 112 generates a clock CLK1 whose frequency is higher than that of a clock signal Xclk by multiplying the clock signal Xclk (e.g., by seven or 7/2). The PLL section 112 has a plurality of switchable operation bands. In Embodiment 1, the PLL section 112 has two switchable operation bands overlapping with each other. The clock CLK1 generated by the PLL section 112 is supplied to the data signal transmitting section 111. Note that a specific example of the PLL section 112 will be described below with reference to drawings different from FIG. 1.

The frequency converting section 113 is means for converting, into an intermediate clock signal Mclk whose frequency is not more than 1/2 as high as that of a clock CLK2 (later described; an operation clock of the control section 12), a clock signal Xclk supplied from an external apparatus. The intermediate clock signal Mclk obtained in the frequency converting section 113 is supplied to the control section 12. Note that a specific example of the frequency converting section 113 will be described below with reference to a drawing different from FIG. 1.

The control section 12 is provided with an OSC (also called an oscillator circuit), and functions to measure a frequency of a clock signal Xclk with use of a clock (second clock) CLK2 independent of a clock CLK1. In Embodiment 1, the control section 12 measures the frequency of the clock signal Xclk with reference to an intermediate clock signal Mclk obtained in the frequency converting section 113. The control section 12 further functions to change an operation band to be used in the PLL section 112 to an operation band of the plurality of switchable operation bands which includes the measured frequency of the clock signal Xclk. In Embodiment 1, when the measured frequency of the clock signal Xclk exceeds a predetermined frequency f0 (included in a part where the two operation bands of the PLL section 112 overlap), the control section 12 changes the operation band to be used in the PLL section 112 to a high-frequency operation band. In contrast, when the measured frequency of the clock signal Xclk is smaller than the predetermined frequency f0, the control section 12 changes the operation band to be used in the PLL section 112 to a low-frequency operation band. The control section 12 further functions to provide the reception apparatus 2 with band information indicative of an operation band to which the operation band to be used in the PLL 112 has been changed.

The band information with which the control section 12 provides the reception apparatus 2 may directly indicate the operation band to which the operation band to be used in the PLL 112 has been changed, or may indirectly indicate the operation band to which the operation band to be used in the PLL 112 has been changed (e.g., the measured frequency of the clock signal Xclk). In other words, the band information is not particularly limited, provided that the reception apparatus 2 can recognize which operation band of the PLL section 112 is selected.

The reason why the frequency converting section 113 is provided in Embodiment 1 is that a case is supposed in which the frequency of the clock signal Xclk (in a case where the frequency of the clock signal Xclk varies, an upper limit of a range of the variation) (e.g., 85 MHz) exceeds half of a frequency (e.g., 25 MHz) of the clock CLK2 of the control section 12 (that is, a case where it is difficult to measure the frequency of the clock signal Xclk with use of the clock CLK2). Like in Embodiment 1, by generating an intermediate clock signal Mclk which does not cause an upper limit of a frequency to exceed half of the frequency of the clock CLK2 of the control section 12 (for example, by dividing the frequency of the clock signal xclk by $2^m$ (where m is an integer of 3 or larger)), it is possible for the control section 12 to correctly measure the frequency of the clock signal Xclk even in this case.

As illustrated in FIG. 1, the reception apparatus 2 includes a receiver 21 and a control section 22. The receiver 21 includes a data signal receiving section 211, a reception processing section 212, and a PLL section 213. The following description will discuss functions of respective blocks included in the reception apparatus 2.

The data signal receiving section 211 reproduces a clock CLK1 with reference to a data signal X, and receives the data signal X with use of the reproduced clock CLK1. In Embodiment 1, the data signal receiving section 211 reproduces the clock CLK1 with a CDR (Clock Data Recovery) function. The clock CLK1 reproduced by the data signal receiving section 211 is supplied to the PLL section 213. The data signal X received by the data signal receiving section 211 is supplied to the reception processing section 212.

The PLL section 213 is means for restoring a clock signal Xclk on the basis of a clock CLK1 reproduced by the data signal receiving section 211. In Embodiment 1, the PLL section 213 restores a clock signal Xclk whose frequency is lower than that of a clock CLK1 by dividing a frequency of the clock CLK1 (e.g., multiplying the frequency of the clock CLK1 by 1/7 or 2/7). The PLL section 213 has a plurality of switchable operation bands, like the PLL section 112 of the transmission apparatus 1. In Embodiment 1, the PLL section 213 has two operation bands overlapping with each other. The clock signal Xclk restored by the PLL section 213 is supplied to the reception processing section 212.

The reception processing section 212 carries out reception processing of a data signal X received by the data signal receiving section 211, with use of a clock signal Xclk restored by the PLL section 213. An example of the reception processing carried out by the reception processing section 212 is output processing in synchronization with data and a clock. The data signal X whose reception processing has been carried out by the reception processing section 212, and the clock signal Xclk restored by the PLL section 213 are supplied to an external apparatus (e.g., a grabber).

The control section 22 functions to obtain, from the control section 12 of the transmission apparatus 1, band information indicative of an operation band of the PLL section 112 of the transmission apparatus 1. The control section 22 further functions to change an operation band of the PLL section 213 to the operation band indicated by the band information obtained from the control section 12 of the transmission apparatus 1. In Embodiment 1, when the band information obtained from the control section 12 of the transmitting apparatus 1 is directly or indirectly indicative of a high-frequency operation band of the plurality of operation bands of the PLL section 112 of the transmission apparatus 1, the control section 22 changes the operation band of the PLL section 213 to the high-frequency operation band. In contrast, when the band information obtained from the control section 12 of the transmitting apparatus 1 is directly or indirectly indicative of a low-frequency operation band of the plurality of operation bands of the PLL section 112 of the transmission apparatus 1, the control section 22 changes the operation band of the PLL section 213 to the low-frequency operation band.

Since the control section 12 of the transmission apparatus 1 uses a clock CLK2 independent of a clock CLK1, the control section 12 can correctly measure a frequency of a clock signal Xclk. Furthermore, the transmission apparatus 1 changes an operation band of the PLL section 112 to an operation band including the measured frequency of the clock signal Xclk, and provides the reception apparatus 2 with band information indicative of the operation band to which the operation band of the PLL section 112 has been changed. The reception apparatus 2 changes an operation band of the PLL section 213 to the operation band indicated by the band information obtained from the transmission apparatus 1. According to the above configurations of the transmission apparatus 1 and the reception apparatus 2, it is possible to equalize (i) the operation band of the PLL section 112 of the transmission apparatus 1 and (ii) the operation band of the PLL section 213 of the reception apparatus 2 to each other. It is therefore possible to improve stability of communication during transmission and reception of data between the transmission apparatus and the reception apparatus.

[Modification of Transmission Apparatus 1]

Figure 2:
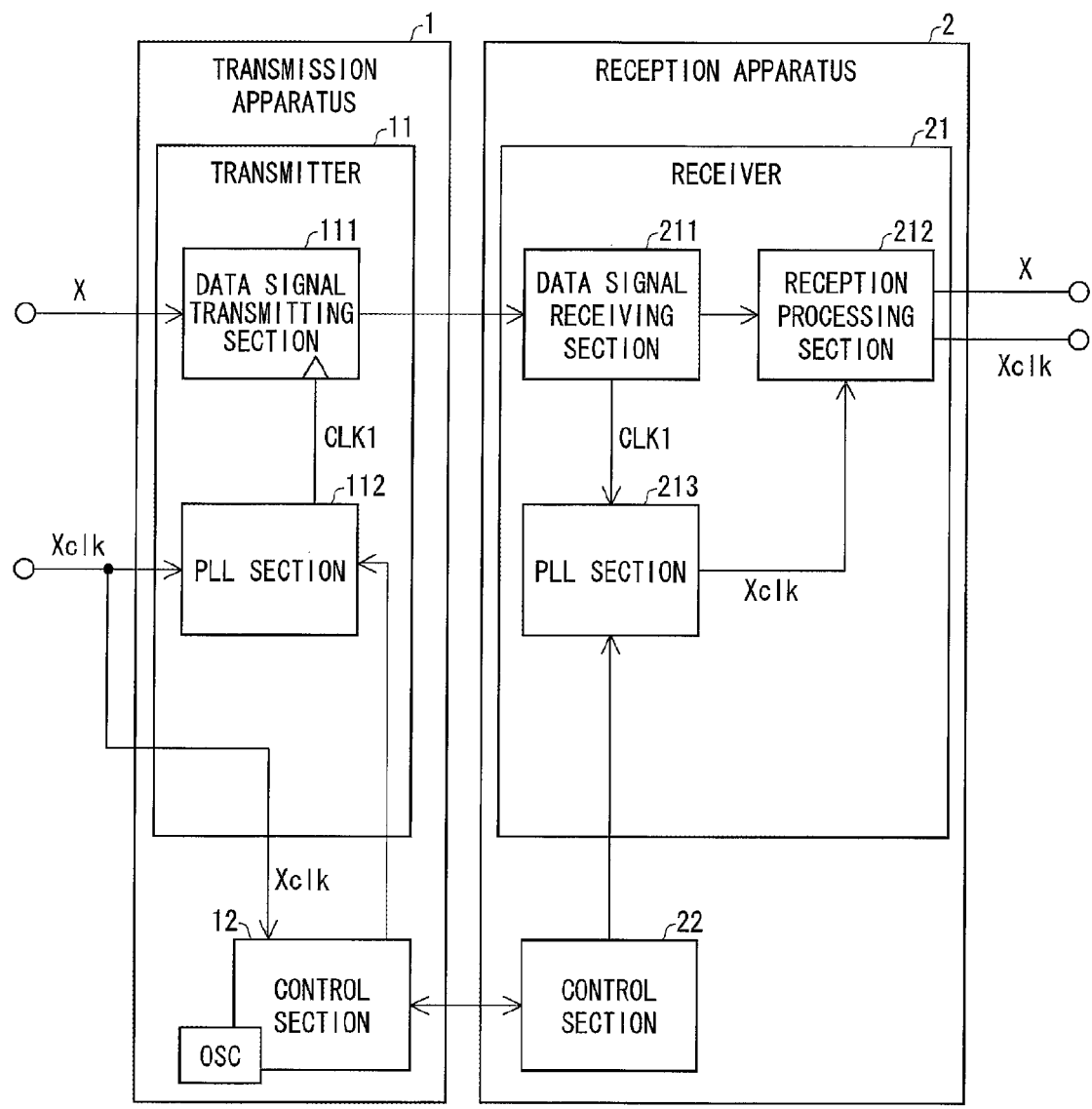
FIG. 2 is a block diagram illustrating configurations of a transmission apparatus and a reception apparatus of a modification of Embodiment 1 of the present invention.

The following description will discuss, with reference to FIG. 2, configurations of modifications of the transmission apparatus 1 and the reception apparatus 2 of Embodiment 1. FIG. 2 is a block diagram illustrating configurations of respective sections of a transmission apparatus 1 and a reception apparatus 2. Note that, in this modification, identical reference numerals are given to members having respective functions identical to those described in the above Embodiment 1, and their descriptions are omitted. What is specially described in this modification is that the transmission apparatus 1 includes no frequency converting section 113, unlike the configuration illustrated in FIG. 1.

In a case where a frequency of a clock signal Xclk (in a case where the frequency of the clock signal Xclk varies, an upper limit of a range of the variation) (e.g., 85 MHz) does not exceed half of a frequency (e.g., 1 MHz) of a clock CLK2 of a control section 12, the control section 12 can correctly measure the frequency of the clock signal Xclk even without any frequency converting section 113 like in this modification.

[Example Configuration of PLL Section 112]

An example configuration of a PLL section 112 will be described below with reference to FIG. 3. (a) of FIG. 3 is a block diagram illustrating the example configuration of the PLL section 112 of the transmission apparatus 1. (b) of FIG. 3 is a graph illustrating operation bands of respective PLL circuits included in the PLL section 112 illustrated in (a) of FIG. 3.

As illustrated in (a) of FIG. 3, the PLL section 112 includes a PLL circuit 112a (first PLL circuit), a frequency converting circuit 112b, a PLL circuit 112c (second PLL circuit), and a switch 112d. Functions of respective blocks included in the PLL section 112 will be described below.

Note that the PLL section 112 is realized with, for example, a FPGA (Field Programmable Gate Array). Note, however, that the present invention is not limited to this.

The PLL circuit 112a is means for generating a clock (first original clock) CLK3'. In Embodiment 1, the PLL circuit 112a multiplies a frequency of a clock signal Xclk by 14 to generate a clock CLK3' whose frequency is higher than that of the clock signal Xclk. In Embodiment 1, the PLL circuit 112a has an operation band (first operation band) of not lower than 20 MHz and not higher than 70 MHz (see (b) of FIG. 3). The clock CLK3' generated by the PLL circuit 112a is supplied to the frequency converting circuit 112b.

The PLL circuit 112c is means for generating a clock (second original clock) CLK4. In Embodiment 1, the PLL circuit 112c multiplies a frequency of a clock signal Xclk by 7 to generate a clock CLK4 whose frequency is higher than that of the clock signal Xclk. In Embodiment 1, the PLL circuit 112c has an operation band (second operation band) partially overlapping with the operation band of the PLL circuit 112a and being not lower than 50 MHz and not higher than 85 MHz (see (b) of FIG. 3). The clock CLK4 generated by the PLL circuit 112c is supplied to a terminal of the switch 112d.

The frequency converting circuit 112b is provided between the PLL circuit 112a and the switch 112d, and is means for equalizing (i) the frequency of the clock CLK4 to be supplied to the switch 112d and (ii) a frequency of a clock CLK3 to be supplied to the switch 112d to each other. In Embodiment 1, the frequency converting circuit 112b multiplies, by 7/14, i.e., 1/2, the clock CLK3' generated by the PLL circuit 112a so that the frequency converting circuit 112b generates the clock CLK3 whose frequency equals to that of the clock CLK4 generated by the PLL circuit 112c. The clock CLK3 generated by the frequency converting circuit 112b is supplied to another terminal of the switch 112d.

The switch 112d is means for switching between connecting the PLL circuit 112a to a data signal transmitting section 111 and connecting the PLL circuit 112c to the data signal transmitting section 111. In Embodiment 1, the switch 112d is controlled by the control section 12. How the control section 12 controls the switch 112d will be described with reference to (b) of FIG. 3.

In Embodiment 1, the control section 12 functions to change an operation band of the PLL section 112 to an operation band including a measured frequency of a clock signal Xclk. As illustrated in (b) of FIG. 3, the operation band of the PLL circuit 112a and the operation band of the PLL circuit 112c partially overlap with each other. When the measured frequency of the clock signal Xclk exceeds a predetermined frequency f0 (included in a part where two operation bands of the PLL section 112 overlap), the control section 12 changes the operation band of the PLL section 112 to a high-frequency operation band. In contract, when the measured frequency of the clock signal Xclk is smaller than the predetermined frequency f0, the control section 12 changes the operation band of the PLL section 112 to a low-frequency operation band. In Embodiment 1, the predetermined frequency f0 is 60 MHz. Note, however, that the present invention is not limited to this, provided that a value included in a part where the operation band of the PLL circuit 112a and the operation band of the PLL circuit 112c overlap is used as a threshold. For example, in Embodiment 1, any value between a lower limit of the operation band of the PLL circuit 112c and an upper limit of the operation band of the PLL circuit 112a, i.e., any value of not lower than 50 MHz and not higher than 70 MHz may be used as the predetermined frequency f0. Note that, like in Embodiment 1, it is preferable to use, as the threshold, a substantial median between the lower limit of the operation band of the PLL circuit 112c and the upper limit of the operation band of the PLL circuit 112a Use of the substantial median as the threshold allows adaptation, with a margin, to environmental conditions such as temperature and noise. This brings about an effect that a problem such as malfunction is unlikely to occur.

In Embodiment 1, when a frequency of a clock signal Xclk which frequency has been measured by the control section 12 is not lower than 60 MHz, the control section 12 controls the switch 112d to switch so that a clock CLK4 generated by the PLL circuit 112c is supplied as a clock CLK1 to the data signal transmitting section 111. In contrast, when the frequency of the clock signal Xclk which frequency has been measured by the control section 12 is lower than 60 MHz, the control section 12 controls the switch 112d to switch so that a clock CLK3 generated by the frequency converting circuit 112b is supplied as a clock CLK1 to the data signal transmitting section 111.

As such, the control section 12 can suitably change the operation band of the PLL section 112.

[Modification of PLL Section 112]

A modification of the PLL section 112 will be described below with reference to FIG. 4. (a) of FIG. 4 is a block diagram illustrating the modification of the PLL section 112 of the transmission apparatus 1. (b) of FIG. 4 is a graph illustrating operation bands of respective PLL circuits included in a PLL section 112 illustrated in (a) of FIG. 4. What is specially described in this modification is that the PLL section 112 includes a plurality of frequency converting circuits.

As illustrated in (a) of FIG. 4, the PLL section 112 includes a PLL circuit 112a, a frequency converting circuit 112b, a PLL circuit 112c, a switch 112d, and a frequency converting circuit 112e. In this modification, identical reference numerals are given to members having respective functions identical to those described in the above Embodiment 1, and their descriptions are omitted. Note that the PLL section 112 of this modification is also realized with, for example, a FPGA (Field Programmable Gate Array). Note, however, that the present invention is not limited to this.

The PLL circuit 112a is means for generating a clock CLK3'. In this modification, the PLL circuit 112a multiplies a frequency of a clock signal Xclk by 28 to generate a clock CLK3' whose frequency is higher than that of the clock signal Xclk. In this modification, the PLL circuit 112a has an operation band of not lower than 20 MHz and not higher than 70 MHz (see (b) of FIG. 4). The clock CLK3' generated by the PLL circuit 112a is supplied to the frequency converting circuit 112b.

The PLL circuit 112c is means for generating a clock CLK4'. In this modification, the PLL circuit 112c multiplies a frequency of a clock signal Xclk by 14 to generate a clock CLK4' whose frequency is higher than that of the clock signal Xclk. In this modification, the PLL circuit 112c has an operation band partially overlapping with the operation band of the PLL circuit 112a and being not lower than 50 MHz and not higher than 85 MHz (see (b) of FIG. 4). The clock CLK4' generated by the PLL circuit 112c is supplied to the frequency converting circuit 112e.

The frequency converting circuit 112b and the frequency converting circuit 112e are provided between the PLL circuit 112a and the switch 112d and/or between the PLL circuit 112c and the switch 112d The frequency converting circuit 112b and the frequency converting circuit 112e are means for equalize (i) a frequency of a clock CLK3 to be supplied to the switch 112d and (ii) a frequency of a clock CLK4 to be supplied to the switch 112d to each other.

In this modification, the frequency converting circuit 112b is provided between the PLL circuit 112a and the switch 112d, and multiplies, by 1/4, a clock CLK3' generated by the PLL circuit 112a so that the frequency converting circuit 112b generates a clock CLK3. The clock CLK3 generated by the frequency converting circuit 112b is supplied to a terminal of the switch 112d.

In this modification, the frequency converting circuit 112e is provided between the PLL circuit 112c and the switch 112d, and multiplies, by 1/2, a clock CLK4' generated by the PLL circuit 112c so that the frequency converting circuit 112e generates a clock CLK4. The clock CLK4 generated by the frequency converting circuit 112e is supplied to another terminal of the switch 112d.

In this modification, the above-described processing equalizes (i) the frequency of the clock CLK3 generated by the frequency converting circuit 112b and (ii) the frequency of the clock CLK4 generated by the frequency converting circuit 112e to each other.

The switch 112d is means for switching between connecting the PLL circuit 112a to the data signal transmitting section 111 and connecting the PLL circuit 112c to the data signal transmitting section 111. Also in this modification, the switch 112d is controlled by the control section 12. How the control section 12 controls the switch 112d is similar to an example illustrated in FIG. 3, and therefore, description thereof is omitted.

What have been described with reference to FIGS. 3 and 4 are example configurations of the PLL sections 112 each including (1) the first PLL circuit 112a, (2) the second PLL circuit 112c, and (3) the switch 112d which switches between connecting the first PLL circuit 112a to the data signal transmitting section 111 and connecting the second PLL circuit 112c to the data signal transmitting section 111. However, the configurations of the PLL sections 112 are not limited to these example configurations. That is, for example, a FPGA (Field Programmable Gate Array) which switches, through reconfiguration processing, between operating as the first PLL circuit and operating as the second PLL circuit may be used as the PLL sections 112.

An example configuration of the frequency converting section 113 will be described below with reference to FIG. 5. FIG. 5 is a block diagram illustrating the example configuration of the frequency converting section 113 of the transmission apparatus 1.

As illustrated in FIG. 5, the frequency converting section 113 includes a $2^{16}$ frequency divider circuit 113a. A function of a block included in the frequency converting section 113 will be described as follows. Note that the frequency converting section 113 is realized with a FPGA (Field Programmable Gate Array). Note, however, that the present invention is not limited to this.

The $2^{16}$ frequency divider circuit 113a is means for generating an intermediate clock signal Mclk by multiplying a frequency of a clock signal Xclk by $1/2^{16}$, i.e., 1/65536. The intermediate clock signal Mclk generated by the $2^{16}$ frequency divider circuit 113a is supplied to the control section 12. The intermediate clock signal Mclk has a waveform obtained by elongating a waveform of the clock signal Xclk in a time-axis direction.

In the example illustrated in FIG. 5, the control section 12 functions to measure the frequency of the clock signal Xclk with reference to the intermediate clock signal Mclk. The control section 12 measures the frequency of the clock signal Xclk with use of a clock CLK2 independent of a clock CLK1. In Embodiment 1, in a case where a pulse width of the intermediate signal Mclk is 1.09 ms, and a predetermined number is $2^{16}$ (65536), the control section 12 measures the frequency of the clock signal Xclk with use of the clock CLK2 independent of the clock CLK1 at (65536/1.09 ms)=60 MHz. Note that processing after the control section 12 measures the frequency of the clock signal Xclk is similar to that described above, and therefore, description of the processing is omitted.

[Example Configuration of Control Section 12]

An example configuration of the control section 12 will be described below with reference to FIG. 6. (a) of FIG. 6 is a block diagram illustrating the example configuration of the control section 12 of the transmission apparatus of Embodiment 1 (b) of FIG. 6 is a block diagram illustrating a modification of the control section 12 of the transmission apparatus of Embodiment 1 of the present invention.

In the example illustrated in (a) of FIG. 6 (hereinafter also called "example configuration (a)"), the control section 12 includes an MCU 121 and an OSC 122. Functions of respective blocks included in the control section 12 will be described as follows.

The OSC 122 is an oscillator circuit configured to generate a clock CLK2 independent of a clock CLK1. The MCU 121 functions to measure a frequency of a clock signal Xclk with use of the clock CLK2 generated by the OSC 122. In the example configuration (a), the MCU 121 is provided with an input pin (not illustrated) and an INT pin (interrupt pin) (not illustrated).

In the example configuration (a), when a frequency of the clock CLK2 is lower than that of the clock signal Xclk, the MCU 121 measures the frequency of the clock signal Xclk with reference to an intermediate clock signal Mclk obtained in the frequency converting section 113. In contrast, when the frequency of the clock CLK2 is higher than that of the clock signal Xclk, the MCU 121 measures the frequency of the clock signal Xclk with reference to the clock signal Xclk itself.

In the example configuration (a), when the intermediate clock signal Mclk obtained in the frequency converting section 113 or the clock signal Xclk is supplied to the input pin of the MCU 121, the MCU 121 measures the frequency of the clock signal Xclk with reference to an input level of the supplied intermediate clock signal Mclk or clock signal Xclk.

In the example configuration (a), when the intermediate clock signal Mclk obtained in the frequency converting section 113 or the clock signal Xclk is supplied to the INT pin of the MCU 121, the MCU 121 measures the frequency of the clock signal Xclk by referring to a rising timing of and a falling timing of the supplied intermediate clock signal Mclk or clock signal Xclk through interrupt processing.

The MCU 121 functions to change an operation band of a PLL section 112 to an operation band including the measured frequency of the clock signal Xclk. In the example configuration (a), when the measured frequency of the clock signal Xclk exceeds a predetermined frequency f0 (included in a part where two operation bands of the PLL section 112 overlap), the MCU 121 changes the operation band of the PLL section 112 to a high-frequency operation band. In contract, when the measured frequency of the clock signal Xclk is smaller than the predetermined frequency f0, the MCU 121 changes the operation band of the PLL section 112 to a low-frequency operation band. The MCU 121 further functions to provide the control section 22 of the reception apparatus 2 with band information indicative of an operation band to which the operation band of the PLL section 112 has been changed.

In an example illustrated in (b) of FIG. 6 (hereinafter also called "example configuration (b)"), a control section 12 includes an MCU 121, an OSC 122, a register circuit 123, and an OSC 124. Functions of respective blocks included in the control section 12 will be described as follows.

The OSC 124 is an oscillator circuit configured to generate a clock CLK2 (second clock) independent of a clock CLK1. The register circuit 123 functions to measure a frequency of a clock signal Xclk with use of the clock CLK2 generated by the OSC 124.

In the example configuration (b), when a frequency of the clock CLK2 is lower than that of the clock signal Xclk, the register circuit 123 measures the frequency of the clock signal Xclk with use of the clock CLK2 by referring, to an intermediate clock signal Mclk obtained in the frequency converting section 113. In contrast, when the frequency of the clock CLK2 is higher than that of the clock signal Xclk, the register circuit 123 measures the frequency of the clock signal Xclk with use of the clock CLK2.

The register circuit 123 functions to change an operation band of the PLL section 112 to an operation band including the measured frequency of the clock signal Xclk. In the example configuration (b), when the measured frequency of the clock signal Xclk exceeds a predetermined frequency f0 (included in a part where two operation bands of the PLL section 112 overlap), the register circuit 123 changes the operation band of the PLL section 112 to a high-frequency operation band. In contract, when the measured frequency of the clock signal Xclk is smaller than the predetermined frequency f0, the register circuit 123 changes the operation band of the PLL section 112 to a low-frequency operation band.

Moreover, the register circuit 123 generates frequency data indicative of the measured frequency of the clock signal Xclk. The frequency data generated by the register circuit 123 is supplied to the MCU 121 connected to the register circuit 123 via an I2C data bus. Note that the frequency data generated by the register circuit 123 is preferably a value indicative of the frequency of the clock signal Xclk. Note, however, that the frequency data generated by the register circuit 123 is not limited to the value. That is, the frequency data generated by the register circuit 123 is not particularly limited, provided that the frequency data generated by the register circuit 123 is data from which the MCU 121 can identify the frequency of the clock signal Xclk, and therefore may be (i) signal data whose frequency equals to that of the clock signal Xclk or (ii) data indicative of a pulse width of the clock signal Xclk.

In the example configuration (b), the OSC 122 is an oscillator circuit configured to generate a clock CLK5 independent of (i) a clock CLK1 and (ii) a clock CLK2. In the example configuration (b), the MCU 121 functions to transmit, with use of the clock CLK5, to the control section 22 of the reception apparatus 2, frequency data supplied from the register circuit 123.

[Example of Application to Camera Link System]

The transmission apparatus 1 and the reception apparatus 2 of Embodiment 1 are applicable to a Camera Link system. The following description will discuss, with reference to FIG. 7, an example in which the transmission apparatus 1 and the reception apparatus 2 of Embodiment 1 are applied to the Camera Link system. FIG. 7 is a block diagram of a Camera Link system including the transmission apparatus 1 and the reception apparatus 2 of Embodiment 1 as a camera-side connector and a grabber-side connector.

As illustrated in FIG. 7, the transmission apparatus 1 and the reception apparatus 2 are connected to each other via a cable 3. The transmission apparatus 1 and the reception apparatus 2 are hereinafter referred to as a camera-side connector 1 and a grabber-side connector 2, respectively. The cable 3 connects a camera to a grabber in conformity to Camera Link.

The camera-side connector 1 includes a transmitter 11. The transmitter 11 is a transmission device configured to transmit data signals X0 through X3 and a clock signal Xclk which are electrical signals supplied from the camera.

The transmitter 11 is connected to a cable 32 housed by the cable 3. The transmitter 11 transmits the data signals X0 through X3 to a grabber side via the cable 32. A grabber side of the cable 32 is connected to a receiver 21 included in the grabber-side connector 2. The receiver 21 supplies the received data signals X0 through X3 and a restored clock signal Xclk to the grabber. A control section 12 connected to the transmitter 11 and a control section 22 connected to the receiver 21 transmit and receive an internal link signal therebetween via a cable 31. Note here that the internal link signal is a signal other than a control signal (e.g., later-described control signals CC0 through CC3) defined by standards (Camera Link), the signal being indicative of internal control information, i.e., a control signal whose external reference is not defined by standards. Examples of the control information transmittable and receivable as the internal link signal include (i) temperature, (ii) internal voltage, (iii) setting values or monitoring values of bias electric current, modulation electric current, light-emitting power, light-receiving power, etc. of an E/O converting section and an O/E converting section (which will be later described), (iv) a LOCK signal from a deserializer, and the like. In Embodiment 1, the camera-side connector 1 supplies band information together with another control information as the internal link signal to the grabber-side connector 2, the band information being indicative of an operation band of a PLL section 112 included in the transmitter 11. Upon reception of control signal including the band information indicative of the operation band of the PLL section 12, the grabber-side connector 2 changes, to an operation band including a frequency indicated by the band information, an operation band of a PLL section 213 included in the receiver 21.

The cable 3 further houses (i) a cable 33 via which a down serial signal is transmitted, (ii) a cable 34 via which control signals CC0 through CC3 are transmitted, and (iii) a cable 35 via which an up serial signal is transmitted. The cables 31 through 35 housed by the cable 3 are all electrical signal lines. However, the present invention is not limited to this. For example, any or all of the cables 31 through 35 may be replaced with an optical fiber(s). The cable 32 that is a high-speed signal line may be replaced with an optical fiber. In the above case, the camera-side connector 1 further includes an E/O converting section which converts an electrical signal into an optical signal, and the grabber-side connector 2 further includes an O/E converting section which converts an optical signal into an electrical signal.

In a transmission and reception system configured as above, the control section 12 of the camera-side connector 1 is connected to the control section 22 of the grabber-side connector 22 via the cable 31. In Embodiment 1, the control section 12 and the control section 22 transmit and receive band information therebetween as an internal link signal. Therefore, the transmission and reception system can improve stability of communication during transmission and reception of data between the transmission apparatus and the reception apparatus.

[Share with Another System]

The following description will discuss, with reference to FIG. 8, a case where a frequency of a clock signal Xclk which frequency the transmission apparatus 1 has measured is shared with another apparatus. FIG. 8 is a block diagram illustrating a system configuration which makes it possible to share, with another system, a frequency of a clock signal Xclk given to the transmission apparatus 1 of Embodiment 1.

As illustrated in FIG. 8, the transmission apparatus 1 is connected to the reception apparatus 2 via a cable 3. As has been described, the control section 12 included in the transmission apparatus 1 shares band information with the control section 22 included in the reception apparatus 2 via the cable 3. This makes it possible to equalize (i) the operation band of the PLL section 112 and (ii) the operation band of the PLL section 213 to each other. Note that a Base cable is used as the cable 3. The transmission apparatus 1, the reception apparatus 2, and the cable 3 constitute a "Base Configuration" in conformity to Camera Link.

In Embodiment 1, the band information transmitted and received between the transmission apparatus 1 and the reception apparatus 2 can be shared further with another apparatus. In Embodiment 1, the control section 22 included in the reception apparatus 2 is connected via a synchronization cable to a control section 52 included in a reception apparatus 5 (see FIG. 8). The control section 52 included in the reception apparatus 5 is further connected via a cable 6 to a control section 42 included in a transmission apparatus 4. Note that, in a case where the cable 6 is a Base cable, a system illustrated in FIG. 8 has the "Medium Configuration" in conformity to Camera Link. In a case where the cable 6 is a Full cable, the system illustrated in FIG. 8 has a "Full Configuration" in conformity to Camera Link. The transmission apparatus 4 and the reception apparatus 5 function in the same manner as the transmission apparatus 1 and the reception apparatus 2, respectively. Therefore, descriptions of the transmission apparatus 4 and the reception apparatus 5 are omitted.

Since the reception apparatus 2 is connected to the reception apparatus 5 via the synchronization cable, it is possible to share band information between transmission and reception systems different from each other. Therefore, a more highly stable communication is attained. Note that Embodiment 1 has described a case where two transmission and reception systems share band information. Note, however, that the present invention is not limited to the case. A configuration may be employed in which three or more transmission and reception systems share band information.

<<Embodiment 2>>

The following description will discuss Embodiment 2 of the present invention with reference to drawings.

[Configurations of Transmission Apparatus and Reception Apparatus]

Configurations of a transmission apparatus 1' of and a reception apparatus 2' of Embodiment 2 of the present invention will be described with reference to FIG. 9. FIG. 9 is a block diagram illustrating the configurations of the transmission apparatus 1' and the reception apparatus 2' of Embodiment 2.

The transmission apparatus 1' is an apparatus configured to transmit a data signal X to the reception apparatus 2'. The transmission apparatus 1' includes a transmitter 11, a control section 12, and a jitter removing section 13. The transmitter 11 and the control section 12 which are included by the transmission apparatus 1' of Embodiment 2 are blocks whose respective functions identical to those of the transmitter 11 and the control section 12 which are included by the transmission apparatus 1 (particularly, the transmission apparatus 1 illustrated in FIG. 2) of Embodiment 1. Therefore, descriptions of the transmitter 11 and the control section 12 which are included by the transmission apparatus 1' of Embodiment 2 are omitted here.

The jitter removing section 13 is configured to remove jitter included in a clock signal Xclk. In Embodiment 2, a clock signal which the transmitter 11 receives is a clock signal X'clk from which the jitter removing section 13 has removed jitter. Similar to the PLL section 112 of Embodiment 1, the jitter removing section 13 is configured so that an operation band is changeable. Note that an example configuration of the jitter removing section 13 whose operation band is changeable will be described later with reference to another drawing.

The control section 12 changes the operation band of the jitter removing section 13. That is, the control section 12 changes the operation band of the jitter removing section 13 to an operation band corresponding to a frequency of a clock signal Xclk which frequency has been determined by a frequency determining circuit 125. The control section 12 also provides the reception apparatus 2' with a link command corresponding to the frequency of the clock signal Xclk which frequency has been determined by the frequency determining circuit 125. The link command and the operation band of the jitter removing section 13 have a correspondence relation via the frequency of the clock signal Xclk. Therefore, the link command can be regarded as band information indicative of the operation band of the jitter removing section 13. Note that change of the operation band of the jitter removing section 13, and a specific example of the link command will be described later with reference to another drawing.

Note that the control section 12 is provided with an OSC. The frequency determining circuit 125 determines (measures) the frequency of the clock signal Xclk with use of a clock oscillated by the OSC.

The reception apparatus 2' is an apparatus configured to receive a data signal X from the transmission apparatus 1'. The reception apparatus 2' includes a receiver 21, a control section 22, and a jitter removing section 23. The receiver 21 and the control section 22 which are included by the reception apparatus 2' of Embodiment 2 are blocks whose respective functions identical to those of the receiver 21 and the control section 22 which are included by the reception apparatus 2 (particularly, the reception apparatus 2 illustrated in FIG. 2) of Embodiment 1. Therefore, descriptions of the receiver 21 and the control section 22 which are included by the reception apparatus 2' of Embodiment 2 are omitted here. Note, however, that a PLL section 213 (not illustrated in FIG. 9) included in the receiver 21 may be replaced with a retiming circuit, a frequency divider circuit or the like whose function is identical to that of a PLL circuit.

Similar to the jitter removing section 13 included by the transmission apparatus 1', the jitter removing section 23 is configured to remove jitter included in a clock signal Xclk. In Embodiment 2, the jitter removing section 23 removes jitter from a clock signal Xclk having been supplied from the receiver 21, and outputs outside the clock signal Xclk from which the jitter has been removed. Similar to the jitter removing section 13 included by the transmission apparatus

1', the jitter removing section 23 is configured so that an operation band is changeable.

The control section 22 changes the operation band of the jitter removing section 23. That is, the control section 22 changes the operation band of the jitter removing section 23 to an operation band corresponding to band information obtained from the transmission apparatus 1'. This uniformalizes (i) setting of the operation band of the jitter removing section 13 included by the transmission apparatus 1' to (ii) setting of the operation band of the jitter removing section 23 included by the reception apparatus 2'.

Similar to the transmitter 11 of the transmission apparatus 1 of Embodiment 1, the transmitter 11 of the transmission apparatus 1' of Embodiment 2 includes a PLL section 112 (see FIG. 2). Similar to the control section 12 of the transmission apparatus 1 of Embodiment 1, the control section 12 of the transmission apparatus 1' of Embodiment 2 changes an operation band of the PLL section 112 to an operation band including a frequency of a clock signal Xclk, and provides the reception apparatus 2' with band information indicative of the operation band to which the operation band of the PLL section 112 has been changed. Similar to the receiver 21 of the reception apparatus 2 of Embodiment 1, the receiver 21 of the reception apparatus 2' of Embodiment 2 includes the PLL section 213 (see FIG. 2). Similar to the control section 22 of the reception apparatus 2 of Embodiment 1, the control section 22 of the reception apparatus 2' of Embodiment 2 obtains the band information from the transmission apparatus 1', and changes an operation band of the PLL section 213 to the operation band indicated by the obtained band information. This links (i) setting of the operation band of the PLL section 112 included by the transmission apparatus 1' to (ii) setting of the operation band of the PLL section 213 included by the reception apparatus 2'.

As such, in Embodiment 2, (i) the setting of the operation band of the jitter removing section 13 included by the transmission apparatus 1' and the setting of the operation band of the jitter removing section 23 included by the reception apparatus 2' are linked to each other, and (ii) the setting of the operation band of the PLL section 112 included by the transmission apparatus 1' and the setting of the operation band of the PLL section 213 included by the reception apparatus 2' are linked to each other. Alternatively, it may be such that (i) the setting of the operation band of the PLL section 112 and the setting of the operation band of the PLL section 213 are not linked to each other, and (ii) only the setting of the operation band of the jitter removing section 13 and the setting of the operation band of the jitter removing section 23 are linked to each other.

Similar to the transmission apparatus 1 and the reception apparatus 2 of Embodiment 1, the transmission apparatus 1' and the reception apparatus 2' of Embodiment 2 are applicable to a Camera Link system (see FIG. 7). That is, the transmission apparatus 1' and the reception apparatus 2' of Embodiment 2 are applicable to a camera-side connector and a grabber-side connector of the Camera Link system. In this case, the above-described link command (the band information indicative of the operation band of the jitter removing section 13), for example, is transmittable as an internal link signal, together with another control information, from the transmission apparatus 1' that is the camera-side connector to the reception apparatus 2' that is the grabber-side connector.

[Example Configuration of Jitter Removing Section 13]

The example configuration of the jitter removing section 13 included by the transmission apparatus 1' will be described with reference to FIG. 10. FIG. 10 is a block diagram illustrating the example configuration of the jitter removing section 13.

The jitter removing section 13 is a jitter cleaner whose operation band is changeable (whose frequency division ratio is changeable). As illustrated in FIG. 10, the jitter removing section 13 includes a first frequency divider circuit 131, a second frequency divider circuit 132, a phase comparator 133, a loop filter 134, a VCO (voltage control oscillator circuit) 135, a third frequency divider circuit 136, and a fourth frequency divider circuit 137. Functions of respective blocks included in the jitter removing section 13 will be described as follows.

The first frequency divider circuit 131 is a frequency divider circuit whose frequency division ratio is changeable and which uses, as the frequency division ratio, a value A written in a register (not illustrated). The first frequency divider circuit 131 receives a clock signal Xclk, and outputs a clock signal whose frequency is 1/A as high as that of the clock signal Xclk. The second frequency divider circuit 132 is a frequency divider circuit whose frequency division ratio is changeable and which uses, as the frequency division ratio, a value B written in a register (not illustrated). The second frequency divider circuit 132 receives a clock signal supplied from the third frequency divider circuit 136, and outputs a clock signal whose frequency is 1/B as high as that of the received clock signal. The clock signals outputted from the first frequency divider circuit 131 and the second frequency divider circuit 132 are supplied to the phase comparator 133.

The phase comparator 133 generates a phase difference signal having a value proportional to a phase difference between the clock signal outputted from the first frequency divider circuit 131 and the clock signal outputted from the second frequency divider circuit 132 (specifically, the phase comparator 133 generates a voltage signal whose voltage is proportional to the phase difference). The phase difference signal generated by the phase comparator 133 is smoothed by the loop filter 134, and then supplied to the VCO 135.

The VCO 135 generates a clock signal having a frequency proportional to a value of the smoothed phase difference signal. The clock signal generated by the VCO 135 is supplied to the third frequency divider circuit 136.

The third frequency divider circuit 136 is a frequency divider circuit whose frequency division ratio is changeable and which uses, as the frequency division ratio, a value C written in a register (not illustrated). The third frequency divider circuit 136 receives the clock signal generated by the VCO 135, and outputs a clock signal whose frequency is 1/C as high as that of the clock signal generated by the VCO 135. The clock signal outputted from the third frequency divider circuit 136 is supplied to the second frequency divider circuit 132 and the fourth frequency divider circuit 137. Note that a frequency division ratio C of the third frequency divider circuit 136 may be fixed.

The fourth frequency divider circuit 137 is a frequency divider circuit whose frequency division ratio is changeable and which uses, as the frequency division ratio, a value D written in a register (not illustrated). The fourth frequency divider circuit 137 receives the clock signal outputted from the third frequency divider circuit 136, and outputs a clock signal whose frequency is 1/D as high as that of the clock signal outputted from the third frequency divider circuit 136. Output from the fourth frequency divider circuit 137 is output from the jitter removing section 13. That is, the clock signal outputted from the fourth frequency divider circuit 137 is a clock signal X'clk.

As such, the jitter removing section 13 includes negative feedback circuits which equalize, to zero, the phase difference (frequency difference) between the clock signal outputted from the first frequency divider circuit 131 and the clock signal outputted from the second frequency divider circuit 132. Therefore, assuming that (i) a frequency of the clock signal Xclk which the first frequency divider circuit 131 receives is fclk and (ii) a frequency of the clock signal outputted from the VCO 135 is fvco, the jitter removing section 13 operates so that fclk/A=fvco/(B×C). Accordingly, provided that frequency division ratios A, B and D are set so that B=A×D is satisfied, a frequency f'clk (=fvco/(C×D)) of the clock signal X'clk outputted from the jitter removing section 13 equals to the frequency fclk of the clock signal Xclk which the jitter removing section 13 receives.

As a time constant of the loop filter 134 increases, response speed of the jitter removing section 13 decreases. That is, the frequency f'clk of the clock signal X'clk outputted from the jitter removing section 13 has difficulty conforming to the frequency fclk of the clock signal Xclk which the jitter removing section 13 receives. This makes it possible to suppress fluctuation of the frequency of the clock signal Xclk which the jitter removing section 13 receives, that is, to remove jitter included in the clock signal Xclk which the jitter removing section 13 receives.

Changing the operation band of the jitter removing section 13 is realized by rewriting of the frequency division ratios A through D written in the registers. In a case where the frequency of the clock signal Xclk is too high or too low, a case will occur in which the frequencies of the clock signals which the phase comparator 133 receives exceed an upper limit of the operation band of the jitter removing section 13 or is lower than a lower limit of the operation band of the jitter removing section 13. However, it is possible to prevent the case from occurring by changing the operation band of the jitter removing section 13 to an operation band corresponding to the clock signal Xclk, that is, by setting the frequency division ratios A through D to values corresponding to the frequency of the clock signal Xclk.

Note that the jitter removing section 23 of the reception apparatus 2' is configured in the same manner as the jitter removing section of the transmission apparatus 1'.

[Changing Operation Band of Jitter Removing Section 13]

As has been described, the control section 12 of the transmission apparatus 1' changes the operation band of the jitter removing section 13 to the operation band corresponding to the frequency of the clock signal Xclk which frequency has been determined by the frequency determining circuit 125. In a case where the jitter cleaner illustrated in FIG. 10 is used as the jitter removing section 13, the frequency division ratios A through D of the respective frequency divider circuits 131, 132, 136 and 137 included in the jitter removing section 13 are changed to values corresponding to a range of a count value outputted from the frequency determining circuit 125.

FIG. 11 shows an example correspondence among (i) a range of the frequency fclk of the clock signal Xclk, (ii) the range of the count value outputted from the frequency determining circuit 125, and (iii) the frequency division ratios A through D of the respective frequency divider circuits 131, 132, 136 and 137 included in the jitter removing section 13.

For example, in a case where the range of the frequency fclk of the clock signal Xclk is not lower than 19 MHz and not higher than 21 MHz, the range of the count value outputted from the frequency determining circuit 125 is not less than 435E and not more than 3B91. In this case, the control section 12 sets, to 100, 5000, 2 and 50, the frequency division ratios A through D of the respective frequency divider circuits 131, 132, 136 and 137 included in the jitter removing section 13, respectively. Also in a case where the frequency fclk of the clock signal Xclk is not lower than 22 MHz, the control section 12 operates in the same manner as above.

When the frequency fclk of the clock signal Xclk is high (specifically, not lower than 42 MHz), the control section 12 sets the frequency division ratio A to a large value (specifically, 200). When the frequency fclk of the clock signal Xclk is low (specifically, not higher than 41 MHz), the control section 12 sets the frequency division ratio A to a small value (specifically, 100). This enables the frequencies of the clock signals which the phase comparator 133 receives to fall within an operation band of the phase comparator 133. The control section 12 further sets the frequency division ratios B, C and D so that B=A×D is satisfied. This equalizes the frequency f'clk of the clock signal X'clk outputted from the jitter removing section 13 to the frequency fclk of the clock signal Xclk which the jitter removing section 13 receives.

[Specific Example of Link Command]

As has been described, the control section 12 of the transmission apparatus 1' provides the reception apparatus 2' with band information indicative of the operation band to which the operation band of the jitter removing section 13 has been changed. In a case where the jitter cleaner illustrated in FIG. 10 is used as the jitter removing section 13, the control section 12 of the transmission apparatus 1' provides the reception apparatus 2' with a link command corresponding to the range of the count value outputted from the frequency determining circuit 125. Since the operation band of the jitter removing section 13 (the frequency division ratios A through D of the respective frequency divider circuits 131, 132, 136 and 137 included in the jitter removing section 13) corresponds to the range of the count value outputted from the frequency determining circuit 125 (see FIG. 11), the link command corresponding to the range of the count value outputted from the frequency determining circuit 125 is indicative of the operation band of the jitter removing section 13.

(a) of FIG. 12 shows a correspondence among (i) the range of the frequency fclk of the clock signal Xfclk, (ii) the range of the count value outputted from the frequency determining circuit 125, and (iii) the link command with which the control section 12 of the transmission apparatus 1' provides the reception apparatus 2'.

For example, in a case where the range of the frequency fclk of the clock signal Xclk is not lower than 19 MHz and not higher than 21 MHz, the range of the count value outputted from the frequency determining circuit 125 is not less than 435E and not more than 3B91. In this case, the control section 12 of the transmission apparatus 1' sets the frequency division ratios A through D of the respective frequency divider circuits 131, 132, 136 and 137 to 100, 5000, 2 and 50, respectively (see FIG. 11), and provides the reception apparatus 2' with a link command E0. Also in a case where the frequency fclk of the clock signal Xclk is not lower than 22 MHz, the control section 12 operates in the same manner as above.

The control section 22 of the reception apparatus 2' changes an operation band of the jitter removing section 23 (frequency division ratios A through D of respective frequency divider circuits included in the jitter removing section 23) in accordance with the link command obtained from the transmission apparatus 1'.

(b) of FIG. 12 shows a correspondence between (i) the link command with which the transmission apparatus 1' provides the control section 22 of the reception apparatus 2' and (ii) the frequency division ratios A through D of the respective frequency divider circuits included in the jitter removing section 23.

For example, in a case where the link command with which the transmission apparatus 1' provides the control section 22 of the reception apparatus 2' is E0, the control section 22 of the reception apparatus 2' sets, to 100, 5000, 2 and 50, the frequency division ratios A through D of the respective frequency divider circuits included in the jitter removing section 23, respectively. This equalizes the operation band of the jitter removing section 23 of the reception apparatus 2' (the frequency division ratios A through D of the respective frequency divider circuits included in the jitter removing section 23) to the operation band of the jitter removing section 13 of the transmission apparatus 1' (the frequency division ratios A through D of the respective frequency divider circuits included in the jitter removing section 13). Also in a case where the frequency fclk of the clock signal Xclk is not lower than 22 MHz, the control section 22 operates in the same manner as above.

<<Embodiment 3>>

The following description will discuss Embodiment 3 of the present invention with reference to drawings.

[Configurations of Transmission Apparatus and Reception Apparatus]

Configurations of a transmission apparatus 1" and a reception apparatus 2" of Embodiment 3 of the present invention will be described with reference to FIG. 13. FIG. 13 is a block diagram illustrating the configurations of the transmission apparatus 1" and the reception apparatus 2" of Embodiment 3.

The transmission apparatus 1" is an apparatus configured to transmit a data signal X to the reception apparatus 2". The transmission apparatus 1" includes a transmitter 11, a control section 12, and a jitter removing section 13. The transmitter 11 and the control section 12 which are included by the transmission apparatus 1" of Embodiment 3 are blocks having respective functions identical to those of the transmitter 11 and the control section 12 which are included by the transmission apparatus 1 (particularly, the transmission apparatus 1 illustrated in FIG. 2) of Embodiment 1. Therefore, descriptions of the transmitter 11 and the control section 12 which are included by the transmission apparatus 1" of Embodiment 3 are omitted here. The jitter removing section 13 included by the transmission apparatus 1" of Embodiment 3 is a block having a function identical to that of the jitter removing section 13 included by the transmission apparatus 1' of Embodiment 2. Therefore, description of the jitter removing section 13 included by the transmission apparatus 1" of Embodiment 3 is omitted here.

Similar to the control section 12 of the transmission apparatus 1' of Embodiment 2, the control section 12 changes an operation band of the jitter removing section 13. That is, the control section 12 changes the operation band of the jitter removing section 13 to an operation band corresponding to a frequency of a clock signal Xclk which frequency has been determined by a frequency determining circuit 125. The control section 12 further provides the reception apparatus 2" with a link command corresponding to the frequency of the clock signal Xclk which frequency has been determined by the frequency determining circuit 125. The link command and the operation band of the jitter removing section 13 have a correspondence relation via the frequency of the clock signal Xclk. Therefore, the link command can be regarded as band information indicative of the operation band of the jitter removing section 13.

For example, in a case where the jitter cleaner illustrated in FIG. 10 is used as the jitter removing section 13, the control section 12 changes, to values corresponding to a range of a count value outputted from the frequency determining circuit 125, frequency division ratios A through D of respective frequency divider circuits 131, 132, 136 and 137 included in the jitter removing section 13. See FIG. 11 as to a correspondence among (i) a range of a frequency fclk of a clock signal Xclk, (ii) the range of the count value outputted from the frequency determining circuit 125, and (iii) the frequency division ratios A through D of the respective frequency divider circuits 131, 132, 136 and 137 included in the jitter removing section 13. What will be later described with reference to another drawing is a correspondence between (i) the range of the count value outputted from the frequency determining circuit 125 and (ii) the link command with which the control section 12 of the transmission apparatus 1" provides the reception apparatus 2".

The reception apparatus 2" is an apparatus configured to receive a data signal X from the transmission apparatus 1". The reception apparatus 2" includes a receiver 21" and a control section 22. The receiver 21" includes a data signal receiving section 211, a reception processing section 212, a PLL section 213, a frequency divider circuit 214, and a jitter removing section 215. The data signal receiving section 211 and the reception processing section 212 which are included by the receiver 21" of Embodiment 3 are blocks having respective functions identical to those of the data signal receiving section 211 and the reception processing section 212 which are included by the receiver 21 of Embodiment 1. Therefore, descriptions of the data signal receiving section 211 and the reception processing section 212 which are included by the receiver 21" of Embodiment 3 are omitted here.

The frequency divider circuit 214 generates, from a clock CLK1 reproduced by the data signal receiving section 211, a clock (1/4) CLK whose frequency is 1/4 as high as that of the clock CLK1, i.e., whose frequency is 7/8 as high as that of a clock signal Xclk. The jitter removing section 215 removes jitter included in the clock (1/4) CLK1 generated by the frequency divider circuit 214. The PLL section 213 restores a clock signal Xclk from the clock (1/4) CLK1' from which the jitter removing section 215 has removed jitter. Note that the PLL section 213 may be replaced with a retiming circuit, a frequency divider circuit or the like whose function is identical to that of a PLL circuit.

As such, in Embodiment 3, the frequency of the clock (1/4) CLK1 to be processed by the jitter removing section 215 is 7/8 as high as that of the clock signal Xclk. It is therefore possible to use, as the jitter removing section 215, a jitter cleaner having a comparatively small operation band, e.g., a jitter cleaner having an operation band approximately in a range from 19 MHz to 90 MHz. Note that, in a case where a jitter cleaner used as the jitter removing section 215 has a sufficiently large operation band, the frequency divider circuit 214 can be omitted.

Similar to the jitter removing section 13 included by the transmission apparatus 1", the jitter removing section 215 is configured so that an operation band is changeable. The control section 22 changes the operation band of the jitter removing section 215. That is, the control section 22 changes the operation band of the jitter removing section 215 to an operation band corresponding to the link command obtained from the transmission apparatus 1".

For example, in a case where a jitter cleaner whose configuration is identical to that of the jitter removing section 13 included by the transmission apparatus 1" is used as the jitter removing section 215, the control section 22 changes, to values corresponding to the link command obtained from the transmission apparatus 1", frequency division ratios A through D of respective frequency divider circuits included in the jitter removing section 215. What will be described later with reference to another drawing is a correspondence between the link command obtained from the transmission apparatus 1" and the frequency division ratios A through D of the respective frequency divider circuits included in the jitter removing section 215.

As such, a configuration is adopted in which the jitter removing section 215 is provided so as to precede the PLL section 213. This makes it possible to attain a more stable communication performance as compared with a configuration where the jitter removing section 215 is provided so as to follow the PLL section 213.

Similar to the transmitter 11 of the transmission apparatus 1 of Embodiment 1, the transmitter 11 of the transmission apparatus 1" of Embodiment 3 includes a PLL section 112 (see FIG. 2). Similar to the control section 12 of the transmission apparatus 1 of Embodiment 1, the control section 12 of the transmission apparatus 1" of Embodiment 3 (i) changes an operation band of the PLL section 112 to an operation band including a frequency of a clock signal Xclk, and (ii) provides the reception apparatus 2" with band information indicative of the operation band to which the operation band of the PLL section 112 has been changed. Similar to the control section 22 of the reception apparatus 2 of Embodiment 1, the control section 22 of the reception apparatus 2" of Embodiment 3 obtains the band information from the transmission apparatus 1", and changes an operation band of the PLL section 213 to the operation band indicated by the obtained band information. This links (i) setting of the operation band of the PLL section 112 included by the transmission apparatus 1" to (ii) setting of the operation band of the PLL section 213 included by the reception apparatus 2".

As such, in Embodiment 3, (i) setting of the operation band of the jitter removing section 13 included by the transmission apparatus 1" and setting of the operation band of the jitter removing section 215 included by the reception apparatus 2" are linked to each other, and (ii) the setting of the operation band of the PLL section 112 included by the transmission apparatus 1" and the setting of the operation band of the PLL section 213 included by the reception apparatus 2" are linked to each other. Alternatively, it may be such that (i) the setting of the operation band of the PLL section 112 and the setting of the operation band of the PLL section 213 are not linked to each other, and (ii) only the setting of the operation band of the jitter removing section 13 and the setting of the operation band of the jitter removing section 215 are linked to each other.

Similar to the transmission apparatus 1 and the reception apparatus 2 of Embodiment 1, the transmission apparatus 1" and the reception apparatus 2" of Embodiment 3 are applicable to a Camera Link system (see FIG. 7). That is, the transmission apparatus 1" and the reception apparatus 2" of Embodiment 3 are applicable to a camera-side connector and a grabber-side connector of the Camera Link system. In this case, the above-described link command (the band information indicative of the operation band of the jitter removing section 13), for example, is transmittable as an internal link signal, together with another control information, from the transmission apparatus 1" that is the camera-side connector to the reception apparatus 2" that is the grabber-side connector.

[Specific Example of Link Command]

(a) of FIG. 14 shows a correspondence among (i) a range of a frequency fclk of a clock signal Xclk, (ii) a range of a count value outputted from the frequency determining circuit 125, and (iii) a link command with which the control section 12 of the transmission apparatus 1" provides the reception apparatus 2".

For example, in a case where the range of the frequency fclk of the clock signal Xclk is not lower than 19 MHz and not higher than 20 MHz, the range of the count value outputted from the frequency determining circuit 125 is not less than 435E and not more than 3E7A. In this case, the control section 12 of the transmission apparatus 1" provides the reception apparatus 2 with a link command F0. Also in a case where the frequency fclk of the clock signal Xclk is not lower than 21 MHz, the control section 12 operates in the same manner as above.

(b) of FIG. 14 shows the correspondence between (i) the link command which the control section 22 of the reception apparatus 2" obtains from the transmission apparatus 1" and (ii) the frequency division ratios A through D of the respective frequency divider circuits included in the jitter removing section 215 of the reception apparatus 2".

For example, in a case where the link command which the control section 22 of the reception apparatus 2" obtains from the transmission apparatus 1" is F0, the control section 22 of the reception apparatus 2" sets, to 100, 5600, 2 and 50, the frequency division ratios A through D of the respective frequency divider circuits included in the jitter removing section 215, respectively. This causes a center frequency of the operation band of the jitter removing section 215 of the reception apparatus 2", the center frequency being determined based on the frequency division ratios A through D of the respective frequency divider circuits, to be approximately 7/8 as high as that of the operation band of the jitter removing section 13 of the transmission apparatus 1".

[Modification of Jitter Removing Section]

Modifications of (i) the jitter removing section 13 included by the transmission apparatus 1" of Embodiment 3 and (ii) the jitter removing section 215 included by the reception apparatus 2" of Embodiment 3 will be described with reference to FIG. 15. (a) of FIG. 15 is a block diagram illustrating the modification of the jitter removing section 13 included by the transmission apparatus 1". (b) of FIG. 15 is a block diagram illustrating the modification of the jitter removing section 215 included by the reception apparatus 2".

As illustrated in (a) of FIG. 15, a transmission-side jitter removing section 13 of this modification includes (i) a first PLL circuit 13a, (ii) a jitter cleaner 13b whose operation band is unchangeable (whose frequency division ratio is unchangeable), and (iii) a second PLL circuit 13c.

The first PLL circuit 13a is a PLL circuit which receives a clock signal Xclk and outputs an intermediate clock signal whose frequency is N/M as high as that of the clock signal Xclk. The numbers "N" and "M" of the first PLL circuit 13a are set by the control section 22. The intermediate clock signal outputted by the first PLL section 13a is supplied to the jitter cleaner 13b.

The jitter cleaner 13b removes jitter included in the intermediate clock signal outputted by the first PLL circuit 13a. The second PLL circuit 13c is a PLL circuit which (i) receives an intermediate clock signal supplied from the jitter cleaner 13b and (ii) outputs a clock signal whose frequency is M/N as high as that of the received intermediate clock signal. The numbers "N" and "M" of the second PLL circuit 13c are set by the control section 22.

As illustrated in (b) of FIG. 15, a reception-side jitter removing section 215 of this modification includes (i) a first PLL circuit 215a, (ii) a jitter cleaner 215b whose operation band is unchangeable (whose frequency division ratio is unchangeable), and (iii) a second PLL circuit 215c.

The first PLL circuit 215a is a PLL circuit which receives a clock (1/4) CLK and outputs an intermediate clock whose frequency is N/M as high as that of the clock (1/4) CLK1. The numbers "N" and "M" of the first PLL circuit 215a are set by the control section 22. The intermediate clock outputted by the first PLL section 215a is supplied to the jitter cleaner 215b.

The jitter cleaner 215b removes jitter included in the intermediate clock signal outputted by the first PLL circuit 215a. The second PLL circuit 215c is a PLL circuit which (i) receives an intermediate clock supplied from the jitter cleaner 215b and (ii) outputs a clock whose frequency is M/N as high as that of the received intermediate clock. The numbers "N" and "M" of the second PLL circuit 215c are set by the control section 22.

An operation band of the transmission-side jitter removing section 13 of this modification is changed by changing the numbers "N" and "M" of the PLL circuits 13a and 13c included in the jitter removing section 13. Since the operation band of the jitter cleaner 13b is unchangeable, a too high or low frequency of the clock signal Xclk will cause a case where a frequency of a clock signal to be supplied to the jitter cleaner 13b exceeds an upper limit of the operation band of the jitter cleaner 13b or is lower than a lower limit of the operation band of the jitter cleaner 13b However, it is possible to prevent such a case from occurring by changing the operation band of the jitter removing section 13 to an operation band corresponding to the frequency of the clock signal Xclk, that is, by setting the numbers "N" and "M" to values corresponding to the frequency of the clock signal Xclk. The same applies to changing an operation band of the reception-side jitter removing section 215 of this modification.

The control section 12 of the transmission apparatus 1" including the jitter removing section 13 of this modification (i) sets the numbers "M" and "N" of the PLL circuits 13a and 13c to values corresponding to a frequency of a clock signal Xclk which frequency has been determined by the frequency determining circuit 125, and (ii) provides the reception apparatus 2" with a link command corresponding to the frequency of the clock signal Xclk which frequency has been determined by the frequency determining circuit 125.

FIG. 16 shows an example correspondence among (i) a range of a frequency fclk of a clock signal Xclk, (ii) a range of a count value outputted from the frequency determining circuit 125, and (iii) the number "N" and "M" of the PLL circuits 13a and 13c included in the jitter removing section 13. (a) of FIG. 17 shows an example correspondence among (i) a range of a frequency fclk of a clock signal Xclk, (ii) a range of a count value outputted from the frequency determining circuit 125, and (iii) a link command with which the control section 12 of the transmission apparatus 1" provides the reception apparatus 2".

The control section 22 of the reception apparatus 2" including the jitter removing section 215 of this modification sets the numbers "M" and "N" of the PLL circuits 215a and 215c to values corresponding to the link command obtained from the transmission apparatus 1".

(b) of FIG. 17 shows a correspondence between (i) the link command which the control section 22 of the reception apparatus 2" obtains from the transmission apparatus 1" and (ii) the numbers "M" and "N" of the PLL circuits 215a and 215c included in the jitter removing section 215.

For example, in a case where the frequency fclk of the clock signal Xclk is 25.0 MHz, the range of the count value outputted from the frequency determining circuit 125 is 363D to (3298) in the table illustrated in FIG. 16. In this case, the control section 12 of the transmission apparatus 1" sets, to 210 and 512, the numbers "N" and "M" of the PLL circuits 13a and 13c included in the jitter removing section 13, respectively. In addition, in the case where the frequency fclk of the clock signal Xclk is 25.0 MHz, the range of the count value outputted from the frequency determining circuit 125 is 363D to (3200) in the table illustrated in (a) of FIG. 17. In this case, the control section 12 of the transmission apparatus 1" provides the reception apparatus 2" with a link command "32". Upon reception of the link command "32", the control section 22 of the reception apparatus 2" sets, to 244 and 512, the numbers "N" and "M" of the PLL circuits 215a and 215c included in the jitter removing section 215, respectively, according to the table illustrated in (b) of FIG. 17. Note that the reason why the number "N" of the PLL circuits 215a and 215c included in the reception-side jitter removing section 215 is 244/210 (approximately 8/7) as large as that of the PLL circuits 13a and 13c included in the transmission-side jitter removing section 13 is that a frequency of a clock (1/4) CLK1 to be processed in the reception-side jitter removing section 215 is 7/8 as high as that of a clock Xclk to be processed in the transmission-side jitter removing section 13.

This modification has described a case where the number "M" is constant (512) whereas the number "N" changes depending on the range of the count value outputted from the frequency determining section 125. However, the present invention is not limited to the case. For example, a case may be employed in which the number "N" is constant whereas the number "M" changes depending on the range of the count value outputted from the frequency determining section 125. Alternatively, a case may be employed in which both the numbers "N" and "M" change depending on the count value outputted from the frequency determining section 125.

Note that the jitter removing section 13 illustrated in (a) of FIG. 15, and the jitter removing section 215 illustrated in (b) of FIG. 15 can be used as the jitter removing section 13 included by the transmission apparatus 1' of Embodiment 2, and the jitter removing section 23 included by the reception apparatus 2' of Embodiment 2, respectively.

SUMMARY

As has been described, a transmission apparatus of an embodiment is configured to include: a PLL (Phase Locked Loop) section which generates a first clock on the basis of a clock signal given to the PLL section; a data signal transmitting section which transmits, with use of the first clock generated by the PLL section, a data signal given to the data signal transmitting section together with the clock signal being given to the PLL section; and a control section which measures a frequency of the clock signal with use of a second clock independent of the first clock, the control section (i) changing setting of the transmission apparatus to setting corresponding to a measured frequency and (ii)

providing, with setting information indicative of the setting to which the setting of the transmission apparatus has been changed, a reception apparatus to which the data signal is to be transmitted.

A reception apparatus of an embodiment is configured to include: a data signal receiving section which (i) reproduces a clock synchronizing with a first clock with use of which a transmission apparatus transmits a data signal, the data signal receiving section reproducing the clock from the data signal which the transmission apparatus has transmitted and (ii) receives, with use of the clock synchronizing with the first clock, the data signal which the transmission apparatus has transmitted; a clock signal restoring section which restores, on the basis of the clock synchronizing with the first clock, a clock signal with reference to which the transmission apparatus generates the first clock; and a control section which (i) obtains, from the transmission apparatus, setting information indicative of setting of the transmission apparatus and (ii) changes setting of the reception apparatus to the setting indicated by the setting information.

A transmission method of an embodiment is configured to include the steps of: (a) generating a first clock on the basis of a clock signal given; (b) transmitting, with use of the first clock generated in the step (a), a data signal given together with the clock signal being given; (c) measuring a frequency of the clock signal with use of a second clock independent of the first clock; (d) changing setting of a transmission apparatus to setting corresponding to a measured frequency; and (e) providing, with setting information indicative of the setting to which the setting of the transmission apparatus has been changed, a reception apparatus to which the data signal is to be transmitted.

A reception method of an embodiment is configured to include the steps of: reproducing a clock synchronizing with a first clock with use of which a transmission apparatus transmits a data signal, the clock being reproduced from the data signal which the transmission apparatus has transmitted; receiving, with use of the clock synchronizing with the first clock, the data signal which the transmission apparatus has transmitted; restoring, on the basis of the clock synchronizing with the first clock, a clock signal with reference to which the transmission apparatus generates the first clock; obtaining, from the transmission apparatus, setting information indicative of setting of the transmission apparatus; and changing setting of a reception apparatus to the setting indicated by the setting information.

According to the configuration, the transmission apparatus measures the frequency of the clock signal with use of the second clock independent of the first clock. This enables the transmission apparatus to grasp fluctuation in the frequency of the clock signal (in a case where the transmission apparatus measures the frequency of the clock signal with use of the first clock, the transmission apparatus cannot grasp the fluctuation in the frequency of the clock signal). According to the configuration, the transmission apparatus further (i) changes the setting of the transmission apparatus to the setting corresponding to the measured frequency of the clock signal and (ii) notifies the reception apparatus of the setting to which the setting of the transmission apparatus has been changed. This makes it possible to conform the setting of the transmission apparatus to setting of the reception apparatus.

Therefore, according to the configuration, it is possible to improve stability of communication during transmission and reception of data between the transmission apparatus and the reception apparatus.

It is preferable to configure the transmission apparatus of the embodiment such that the PLL section is configured so that an operation band is changeable, and the control section changes the operation band of the PLL section to an operation band including the measured frequency, and provides the reception apparatus, as the setting information, with band information indicative of the operation band to which the operation band of the PLL section has been changed.

According to the configuration, it is possible to equalize the operation band of the PLL section of the transmission apparatus to an operation band of a PLL section of the reception apparatus.

It is preferable to configure the transmission apparatus of the embodiment to further include a frequency converting section which converts the clock signal to an intermediate clock signal whose frequency is not more than 1/2 as high as that of the second clock, and the control section measuring the frequency of the clock signal with reference to the intermediate clock signal.

In a case where the frequency of the clock signal is more than 1/2 as high as that of the second clock, it is not possible to correctly measure the frequency of the clock signal with use of the second clock (sampling theorem). On the other hand, according to the configuration, even in the case where the frequency of the clock signal is more than 1/2 as high as that of the second clock, it is possible to correctly measure the frequency of the clock signal with use of the second clock.

It is preferable to configure the transmission apparatus of the embodiment so that the PLL section includes (i) a first PLL circuit generating a first original clock and having a first operation band, (ii) a second PLL circuit generating a second original clock whose frequency is different from that of the first original clock and having a second operation band which partially overlaps with the first operation band, (iii) a switch which switches between connecting the first PLL circuit to the data signal transmitting section and connecting the second PLL circuit to the data signal transmitting section, and (iv) a frequency converting circuit being provided at least one of (a) between the first PLL circuit and the switch and (b) between the second PLL circuit and the switch, and the frequency converting circuit equalizing (i) the frequency of the first original clock to be supplied to the switch and (ii) the frequency of the second original clock to be supplied to the switch to each other.

According to the configuration, the PLL section includes (i) the first and second PLL circuits whose operation bands partially overlap with each other and (ii) the switch which switches between connecting the first PLL circuit and connecting the second PLL circuit. Therefore, it is possible to change the operation band of the PLL section by causing the switch to switch in accordance with the frequency of the clock signal which frequency has been measured by the transmission apparatus. Particularly, according to the configuration, the first PLL circuit is different in multiplication constant from the second PLL circuit. On the other hand, the PLL section includes the frequency converting circuit. Therefore, even in a case where an operation band is changed, it is possible to set, to be constant, a multiplication constant of a frequency of the first clock generated by the PLL section.

Therefore, according to the configuration, it is possible to more suitably change the operation band of the PLL section.

It is preferable to configure the transmission apparatus of the embodiment to further include a jitter removing section (i) which removes jitter included in the clock signal which the PLL section receives and (ii) whose operation band is changeable, the control section (i) changing the operation band of the jitter removing section to an(the) operation band including the measured frequency and (ii) providing the reception apparatus, as the setting information, band information indicative of the operation band to which the operation band of the jitter removing section has been changed.

According to the configuration, it is possible to equalize the operation band of the jitter removing section of the transmission apparatus to an operation band of a jitter removing section of the reception apparatus.

It is preferable to configure the reception apparatus of the embodiment such that the PLL section is configured so that an operation band is changeable, and the control section (i) obtains, as the setting information, from the transmission apparatus, band information indicative of the operation band of the PLL section included by the transmission apparatus and (ii) changes, to the operation band indicated by the band information, the operation band of the PLL section included by the reception apparatus.

According to the configuration, it is possible to equalize the operation band of the PLL section of the reception apparatus to the operation band of the PLL section of the transmission apparatus.

It is preferable to configure the reception apparatus of the embodiment to further include a jitter removing section (i) which removes jitter included in the clock signal to be supplied from the clock signal restoring section and (ii) whose operation band is changeable, and the control section (i) obtaining, as the setting information, from the transmission apparatus, band information indicative of an operation band of a jitter removing section included by the transmission apparatus and (ii) changing, to the operation band indicated by the band information, the operation band of the jitter removing section included by the reception apparatus.

According to the configuration, it is possible to equalize the operation band of the jitter removing section of the reception apparatus to the operation band of the jitter removing section of the transmission apparatus.

It is preferable to configure the reception apparatus of the embodiment to further include a jitter removing section (i) which removes jitter included in the clock signal which the clock signal restoring section receives and (ii) whose operation band is changeable, and the control section (i) obtaining, as the setting information, from the transmission apparatus, band information indicative of an operation band of a jitter removing section included by the transmission apparatus and (ii) changing, to the operation band indicated by the band information, the operation band of the jitter removing section included by the reception apparatus.

According to the configuration, it is possible to set the operation band of the jitter removing section of the reception apparatus so as to correspond to the operation band of the jitter removing section of the transmission apparatus. Furthermore, since the jitter removing section is provided so as to precede the PLL section, it is possible to attain a more stable communication performance as compared with a case where the jitter removing section is provided so as to follow the PLL section.

It is preferable to configure the reception apparatus of the embodiment so that a frequency divider circuit which decreases a frequency of the clock is provided so as to precede the jitter removing section.

According to the configuration, it is possible to use, as the jitter removing section, a jitter cleaner having a smaller operation band.

It is preferable to configure the reception apparatus of the embodiment so that the jitter removing section includes (i) a first frequency divider circuit which generates an intermediate clock whose frequency is N/M as high as that of an input clock, (ii) a jitter cleaner which removes jitter included in the intermediate clock, and (iii) a second frequency divider circuit which generates an output clock whose frequency is M/N as high as that of the intermediate clock from which the jitter cleaner has removed the jitter.

According to the configuration, it is possible to configure the jitter removing section with a jitter cleaner whose operation band is unchangeable.

Note that the present invention encompasses a transmission and reception system including the transmission apparatus and the reception apparatus. In the transmission and reception system, for example, the transmission apparatus and the reception apparatus are connected to each other via a signal line via which the transmission apparatus and the reception apparatus transmit and receive internal control information, and the setting information is transmitted and received via the signal line.

According to the configuration, the setting information is transmitted and received via the signal line via which the internal control information is transmitted and received. Therefore, the transmission and reception system (e.g., a Camera Link system) including the signal line via which the internal control information is transmitted and received can transmit and receive setting information without including any additional signal line.

The present invention also encompasses a transmission and reception system including: a first transmission path including (i) a first transmission apparatus that is the transmission apparatus of the embodiment and (ii) a first reception apparatus that is the reception apparatus of the embodiment; and a second transmission path including (i) a second transmission apparatus that is the transmission apparatus of the embodiment and (ii) a second reception apparatus that is the reception apparatus of the embodiment, the first reception apparatus included by the first transmission path and the second reception apparatus included by the second transmission path sharing the setting information with each other.

According to the configuration, it is possible to share setting information between transmission and reception systems different from each other. This allows a more stable communication.

<<Additional Description>>

The present invention is not limited to the embodiments, but can be altered by a skilled person in the art within the scope of the claims. An embodiment derived from a proper combination of technical means each disclosed in a different embodiment is also encompassed in the technical scope of the present invention.

For example, Embodiment 1 has described a case where setting of the PLL section of the transmission apparatus is uniformalized to setting of the PLL section of the reception apparatus, and Embodiment 2 has described a case where setting of the jitter removing section of the transmission apparatus is uniformalized to setting of the jitter removing section of the reception apparatus. However, the present invention is not limited to the cases. For example, setting (Reconfiguration) of FPGA, setting of filter constant, setting of various indicators may be uniformalized between a transmission apparatus and a reception apparatus. Moreover, an example application can be employed in which, for example, a reception apparatus is notified of whether or not a clock determined in a transmission apparatus exists (whether or not a camera is being connected), and when the reception apparatus is notified that no clock exists, the reception apparatus stops supply of electric power. Alternatively, an example application to setting and control of an external apparatus may be employed in which example application a control section which controls front wheels of an automobile (i) is notified of the number of revolutions of rear wheels of the automobile, and (ii) optimizes the number of revolutions of the front wheels.

INDUSTRIAL APPLICABILITY

The present invention is generally and widely applicable to a transmission system which transmits a data signal accompanied by a clock signal. The present invention is applicable to, for example, Camera Link.

REFERENCE SIGNS LIST 1, 1', and 1": Transmission apparatus
11: Transmitter
111: Data signal transmitting section
112: PLL section
112a: PLL circuit (first PLL circuit)
112b: Frequency converting circuit
112c: PLL circuit (second PLL circuit)
112d: Switch
112e: Frequency converting circuit
113: Frequency converting section
113a: $2^{16}$ frequency divider circuit
12: Control section
13: Jitter removing section
2, 2', and 2": Reception apparatus
21: Receiver
211: Data signal receiving section
212: Reception processing section
213: PLL section (clock signal restoring section)
214: Frequency divider circuit
215: Jitter removing section
22: Control section
23: Jitter removing section
3: Cable
4: Transmission apparatus
42: Control section
5: Reception apparatus
52: Control section
6: Cable

The invention claimed is:

1. A transmission apparatus, comprising:
a PLL (Phase Locked Loop) section which generates a first clock on the basis of a clock signal given to the PLL section;
a data signal transmitting section which transmits, with use of the first clock generated by the PLL section, a data signal given to the data signal transmitting section together with the clock signal being given to the PLL section; and
a control section which measures a frequency of the clock signal with use of a second clock independent of the first clock,
the control section (i) changing setting of the transmission apparatus to setting corresponding to the measured frequency and (ii) providing, with setting information indicative of the setting to which the setting of the transmission apparatus has been changed, a reception apparatus to which the data signal is to be transmitted.

2. The transmission apparatus as set forth in claim 1, wherein the PLL section is configured so that its operation band is changeable, and
the control section changes the operation band of the PLL section to an operation band including the measured frequency, and provides the reception apparatus, as the setting information, with band information indicative of the operation band to which the operation band of the PLL section has been changed.

3. The transmission apparatus as set forth in claim 2, further comprising a frequency converting section which converts the clock signal to an intermediate clock signal whose frequency is not more than 1/2 as high as that of the second clock, and
the control section measuring the frequency of the clock signal with reference to the intermediate clock signal.

4. The transmission apparatus as set forth in claim 2, wherein the PLL section includes (i) a first PLL circuit generating a first original clock and having a first operation band, (ii) a second PLL circuit generating a second original clock whose frequency is different from that of the first original clock and having a second operation band which partially overlaps with the first operation band, (iii) a switch which switches between connecting the first PLL circuit to the data signal transmitting section and connecting the second PLL circuit to the data signal transmitting section, and (iv) a frequency converting circuit being provided at least one of (a) between the first PLL circuit and the switch and (b) between the second PLL circuit and the switch, and
the frequency converting circuit equalizing (i) the frequency of the first original clock to be supplied to the switch and (ii) the frequency of the second original clock to be supplied to the switch.

5. The transmission apparatus as set forth in claim 1, further comprising a jitter removing section which removes jitter included in the clock signal which the PLL section receives, an operation band of the jitter removing section being changeable,
the control section (i) changing the operation band of the jitter removing section to an operation band including the measured frequency and (ii) providing the reception apparatus, as the setting information, band information indicative of the operation band to which the operation band of the jitter removing section has been changed.

6. A reception apparatus, comprising:
a data signal receiving section which (i) reproduces a clock synchronizing with a first clock with use of which a transmission apparatus transmits a data signal, the data signal receiving section reproducing the clock from the data signal which the transmission apparatus has transmitted and (ii) receives, with use of the clock synchronizing with the first clock, the data signal which the transmission apparatus has transmitted;
a clock signal restoring section which restores, on the basis of the clock synchronizing with the first clock, a clock signal with reference to which the transmission apparatus generates the first clock; and
a control section which (i) obtains, from the transmission apparatus, setting information indicative of setting of the transmission apparatus and (ii) changes setting of the reception apparatus to the setting indicated by the setting information.

7. The reception apparatus as set forth in claim 6, wherein the clock signal restoring section is a PLL (Phase Locked Loop) section, an operation band of the PLL section being changeable, and
the control section (i) obtains, as the setting information, from the transmission apparatus, band information indicative of an operation band of a PLL section included by the transmission apparatus and (ii)

changes, to the operation band indicated by the band information, the operation band of the PLL section included by the reception apparatus.

8. The reception apparatus as set forth in claim 6, further comprising a jitter removing section which removes jitter included in the clock signal to be supplied from the clock signal restoring section, an operation band of the jitter removing section being changeable, and the control section (i) obtaining, as the setting information, from the transmission apparatus, band information indicative of an operation band of a jitter removing section included by the transmission apparatus and (ii) changing, to the operation band indicated by the band information, the operation band of the jitter removing section included by the reception apparatus.

9. The reception apparatus as set forth in claim 6, further comprising a jitter removing section which removes jitter included in the clock signal which the clock signal restoring section receives, an operation band of the jitter removing section being changeable, and the control section (i) obtaining, as the setting information, from the transmission apparatus, band information indicative of an operation band of a jitter removing section included by the transmission apparatus and (ii) changing, to the operation band indicated by the band information, the operation band of the jitter removing section included by the reception apparatus.

10. The reception apparatus as set forth in claim 9, wherein a frequency divider circuit which decreases a frequency of the clock is provided so as to precede the jitter removing section.

11. The reception apparatus as set forth in claim 8, wherein the jitter removing section includes (i) a first frequency divider circuit which generates an intermediate clock whose frequency is N/M as high as that of an input clock, (ii) a jitter cleaner which removes jitter included in the intermediate clock, and (iii) a second frequency divider circuit which generates an output clock whose frequency is M/N as high as that of the intermediate clock from which the jitter cleaner has removed the jitter, where each of N and M is a positive integer.

12. A transmission and reception system, comprising:
a transmission apparatus; and
a reception apparatus,
the transmission apparatus comprising:
a PLL (Phase Locked Loop) section which generates a first clock on the basis of a clock signal given to the PLL section;
a data signal transmitting section which transmits, with use of the first clock generated by the PLL section, a data signal given to the data signal transmitting section together with the clock signal being given to the PLL section; and
a control section which measures a frequency of the clock signal with use of a second clock independent of the first clock,
the control section (i) changing setting of the transmission apparatus to setting corresponding to the measured frequency and (ii) providing, with setting information indicative of the setting to which the setting of the transmission apparatus has been changed, the reception apparatus to which the data signal is to be transmitted,
the reception apparatus comprising:
a data signal receiving section which (i) reproduces a clock synchronizing with a first clock with use of which the transmission apparatus transmits a data signal, the data signal receiving section reproducing the clock from the data signal which the transmission apparatus has transmitted and (ii) receives, with use of the clock synchronizing with the first clock, the data signal which the transmission apparatus has transmitted;
a clock signal restoring section which restores, on the basis of the clock synchronizing with the first clock, a clock signal with reference to which the transmission apparatus generates the first clock; and
a control section which (i) obtains, from the transmission apparatus, the setting information which is provided by the transmission apparatus and (ii) changes setting of the reception apparatus to the setting indicated by the setting information.

13. The transmission and reception system as set forth in claim 12, wherein the transmission apparatus and the reception apparatus are connected to each other via a signal line via which the transmission apparatus and the reception apparatus transmit and receive internal control information, and the setting information is transmitted and received via the signal line.

* * * * *